(12) United States Patent
Tortorelli et al.

(10) Patent No.: US 10,777,291 B2
(45) Date of Patent: Sep. 15, 2020

(54) DRIFT MITIGATION WITH EMBEDDED REFRESH

(71) Applicant: Micron Technology, Inc., Boise, ID (US)

(72) Inventors: Innocenzo Tortorelli, Cernusco Sul Naviglio (IT); Agostino Pirovano, Milan (IT); Andrea Redaelli, Casatenovo (IT); Fabio Pellizzer, Boise, ID (US); Hongmei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/284,491

(22) Filed: Feb. 25, 2019

(65) Prior Publication Data

US 2019/0206506 A1    Jul. 4, 2019

Related U.S. Application Data

(63) Continuation of application No. 15/857,125, filed on Dec. 28, 2017, now Pat. No. 10,269,442.

(51) Int. Cl.
| | | |
|---|---|---|
| *G11C 13/00* | (2006.01) | |
| *G11C 29/00* | (2006.01) | |
| *H01L 27/24* | (2006.01) | |
| *H01L 45/00* | (2006.01) | |
| *G11C 29/52* | (2006.01) | |

(52) U.S. Cl.
CPC ............ *G11C 29/00* (2013.01); *G11C 13/004* (2013.01); *G11C 13/0033* (2013.01); *G11C 29/52* (2013.01); *H01L 27/2409* (2013.01); *H01L 27/2427* (2013.01); *H01L 27/2463* (2013.01); *H01L 27/2481* (2013.01); *H01L 45/06* (2013.01); *H01L 45/08* (2013.01); *H01L 45/1233* (2013.01); *H01L 45/142* (2013.01); *H01L 45/143* (2013.01); *H01L 45/144* (2013.01); *G11C 13/00* (2013.01);
(Continued)

(58) Field of Classification Search
CPC . G11C 13/0033; H01L 45/144; H01L 45/143; H01L 27/2481; H01L 45/142
See application file for complete search history.

(56) References Cited

U.S. PATENT DOCUMENTS 9,613,676 B1    4/2017   Wang et al.
2004/0062071 A1    4/2004   Rodriguez et al.
(Continued)

OTHER PUBLICATIONS

ISA/KR, International Search Report and Written Opinion of the International Searching Authority, Int'l. Appl. No. PCT/US2018/064928, dated Apr. 9, 2019, Korean Intellectual Property Office, Seo-gu, Daejeon, Republic of Korea, 13 pgs.

*Primary Examiner* — Ajay Ojha
(74) *Attorney, Agent, or Firm* — Holland & Hart LLP

(57) ABSTRACT

Methods, systems, and devices for drift mitigation with embedded refresh are described. A memory cell may be written to and read from using write and read voltages, respectively, that are of different polarities. For example, a memory cell may be written to by applying a first write voltage and may be subsequently read from by applying a first read voltage of a first polarity. At least one additional (e.g., a second) read voltage—a setback voltage—of a second polarity may be utilized to return the memory cell to its original state. Thus the setback voltage may mitigate a shift in the voltage distribution of the cell caused by the first read voltage.

20 Claims, 10 Drawing Sheets

(52) U.S. Cl.
CPC .. *G11C 13/0004* (2013.01); *G11C 2013/0052* (2013.01); *G11C 2213/71* (2013.01)

(56) References Cited

U.S. PATENT DOCUMENTS

| | | |
|---|---|---|
| 2007/0211512 A1 | 9/2007 | Shuto |
| 2009/0201740 A1 | 8/2009 | Willer et al. |
| 2010/0195372 A1 | 8/2010 | Toda |
| 2011/0305071 A1 | 12/2011 | Yan et al. |
| 2013/0028004 A1 | 1/2013 | Snider |
| 2014/0085963 A1 | 3/2014 | Schwartz |
| 2016/0111150 A1 | 4/2016 | Bazarsky et al. |
| 2017/0125097 A1 | 5/2017 | Tortorelli et al. |
| 2018/0040370 A1 | 2/2018 | Tortorelli et al. |
| 2018/0122468 A1 | 5/2018 | Pirovano et al. |

DRIFT MITIGATION WITH EMBEDDED REFRESH

CROSS REFERENCE

The present application for patent is a continuation of U.S. patent application Ser. No. 15/857,125, by Tortorelli et al., entitled "Drift Mitigation with Embedded Refresh," filed Dec. 28, 2017, now U.S. Pat. No. 10,269,442, assigned to the assignee hereof, and is expressly incorporated by reference in its entirety herein.

BACKGROUND

The following relates generally to determining a logic state of a memory cell and more specifically to drift mitigation with embedded refresh.

Memory devices are widely used to store information in various electronic devices such as computers, wireless communication devices, cameras, digital displays, and the like. Information is stored by programming different states of a memory device. For example, binary devices have two states, often denoted by a logic 1 or a logic 0. In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory such as PCM may maintain a stored logic state for extended periods of time even in the absence of an external power source. Volatile memory such as DRAM may lose a stored state over time unless it is periodically refreshed by an external power source.

Improving memory devices, generally, may include increasing memory cell density, increasing read/write speeds, increasing reliability, increasing data retention, reducing power consumption, or reducing manufacturing costs, among other metrics. Access operations may cause a shift (e.g., drift) of the threshold voltage of a memory cell. Such a shift may result in reduced reliability relating to subsequent reading the memory cell, and in some instances may result in data loss.

DETAILED DESCRIPTION

Figure 1:
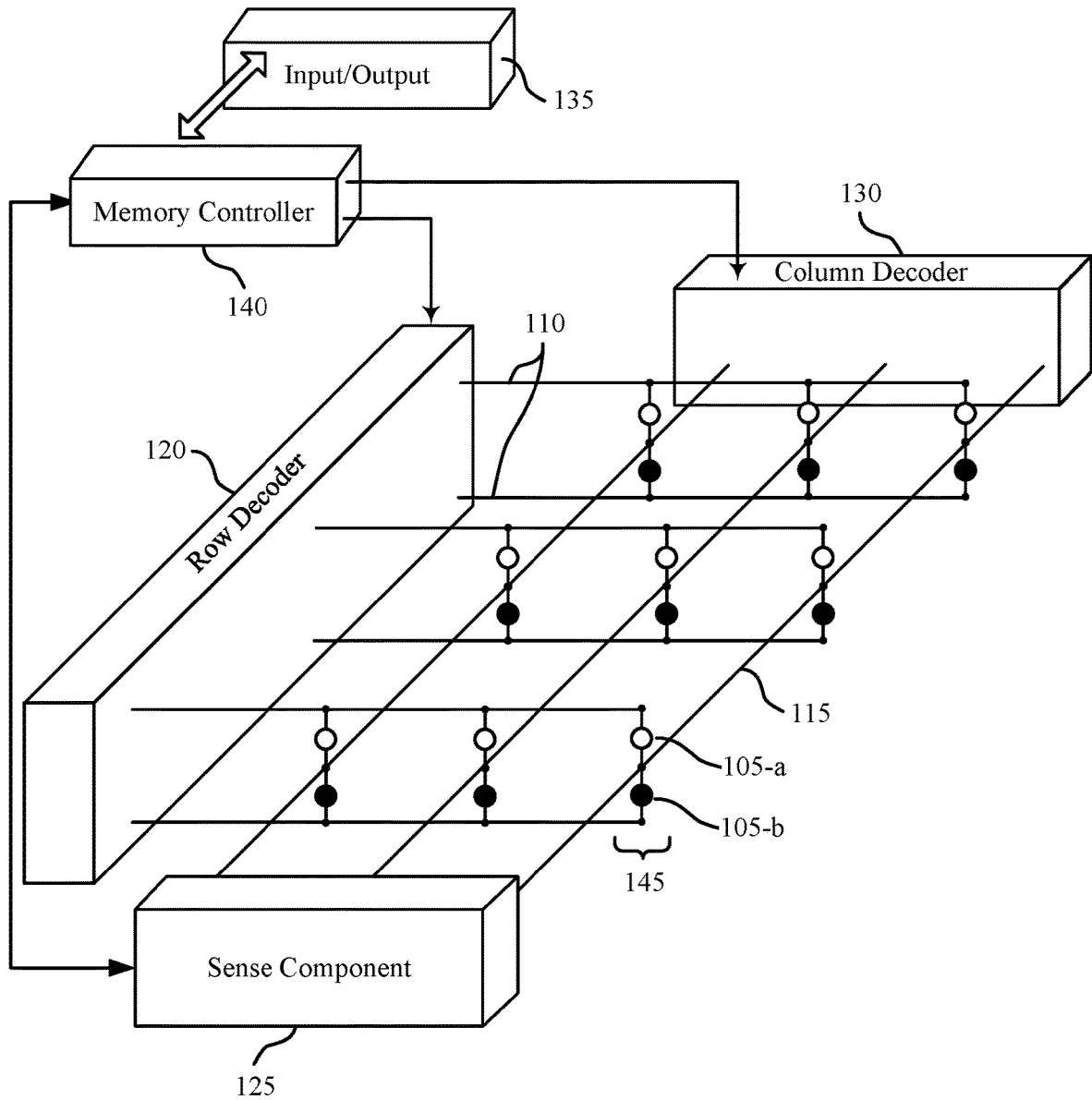
FIG. 1 illustrates an example of a memory array that supports drift mitigation with embedded refresh in accordance with examples of the present disclosure.

In accordance with examples of the present disclosure, a memory cell may be written to using a first polarity and read using a second, different (e.g., opposite) polarity. Access operations related to a memory cell, such as a read operation, may cause a shift in a threshold voltage of the memory cell when storing a particular logic state, and such a shift may reduce reliability of reading the stored logic state in a subsequent read operation. In some example the shift may result complete or partial data loss of the memory cell. Thus, a process capable of preventing or mitigating shift in the threshold voltage across the memory cell by refreshing the original threshold voltage across the memory cell may allow for increased reliability during an operation (e.g., a read operation), and may prevent data loss of the memory cell.

In a first example, a first write voltage may be applied to a memory cell coupled with a first access line and a second access line. The memory cell may include a memory storage element and a selector device or, in other examples, the memory cell may be a self-selecting memory cell (e.g., including a single, self-selecting material that may be configured to act as both a selector and as a memory element). In some examples, after applying the write voltage (e.g., writing a logic state to the memory cell), a first read voltage may be applied to the memory cell. The first read voltage may, for example, be applied with a first polarity and may be applied after the application of the write voltage. In some examples, the first polarity may be a positive polarity and, in other examples, the first polarity may be a negative polarity. After applying the first read voltage to the memory cell, a second read voltage—which may be associated with a refresh operation in some examples—may be applied to the memory cell. The second read voltage may be applied with a second polarity different from the first polarity and may, in some examples, revert or facilitate the reversion of the composition of the memory cell back to a prior state. For example, the application of the second read voltage may revert the composition of the memory cell back to a same state as the earlier write operation.

In another example, a first write voltage may be applied to a memory cell coupled with a first access line and a second access line. As described above, the memory cell may include a memory storage element and a selector device. After applying the write voltage, a first read voltage may be applied to the memory cell. The first read voltage may, for example, be applied with a first polarity and may be applied after the write voltage. In some examples, the first polarity may be a positive polarity and, in other examples, the first polarity may be a negative polarity. After applying the first read voltage to the memory cell, a second read voltage—which may begin a refresh operation of the memory cell in some examples—may be applied to the memory cell. The second read voltage may be applied with a second polarity different from the first polarity and may, in some examples, aid in the reversion of the composition of the memory cell back to a prior state. After applying the second read voltage, a third read voltage may be applied to the memory cell with the first polarity. The third read voltage may revert or facilitate the reversion of the composition of the memory cell back to a prior state. For example, the application of the third read voltage may revert the composition of the memory cell back to a same state as post-write-operation.

In yet another example, a first write voltage may be applied to a memory cell coupled with a first access line and a second access line, the memory cell including a memory storage element and a selector device. After applying the write voltage, a first read voltage may be applied to the memory cell with a first polarity. The first read voltage may be applied after the write voltage. In some examples, the first polarity may be a positive polarity and, in other examples, the first polarity may be a negative polarity. After applying the first read voltage to the memory cell, a second read voltage—which may begin a refresh operation of the memory cell—may be applied to the memory cell. The second read voltage may be applied with a second polarity different from the first polarity and may, in some examples, aid in the reversion of the composition of the memory cell back to a prior state. After applying the second read voltage, a third read voltage may be applied to the memory cell with the first polarity. The third read voltage may further-aid in the reversion of the composition of the memory cell back to a prior state. After applying the third read voltage, a fourth read voltage may be applied to the memory cell, which may revert or facilitate the reversion of the composition of the memory cell back to a prior state. For example, the application of the third read voltage may revert the composition of the memory cell back to a same state as post-write-operation.

Further features of the disclosure broadly introduced above are described below in the context of memory arrays that supports drift mitigation with embedded refresh. These and other features of the disclosure are further illustrated by and described with reference to timing diagrams, apparatus diagrams, system diagrams, and flowcharts that relate to drift mitigation with embedded refresh.

FIG. 1 illustrates a memory array 100 that supports drift mitigation with embedded refresh in accordance with various examples of the present disclosure. Memory array 100 may also be referred to as an electronic memory apparatus. Memory array 100 includes memory cells 105 that are programmable to store different logic states. Each memory cell 105 may be programmable to store two logic states, which may be denoted as a logic 0 and a logic 1. In some cases, a memory cell 105 may be configured to store more than two logic states.

In some examples a memory cell 105 may include a material portion, which may be referred to as a memory element or memory storage element, that has a variable and configurable electrical resistance representative of different logic states. For example, a material that can take the form of a crystalline atomic configuration or an amorphous atomic configuration (e.g., able to maintain either a crystalline state or an amorphous state over an operating temperature range, such as room temperature) may have different electrical resistances depending on the atomic configuration. A more-crystalline state of the material (e.g., a single crystal, or a collection of a relatively large crystal grains that is substantially crystalline) may have a relatively low electrical resistance, and may be referred to as a "SET" logic state. A more-amorphous state of the material (e.g., an entirely amorphous state, or some distribution of relatively small crystal grains that is substantially amorphous) may have a relatively high electrical resistance, and may be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples a memory element may be configured with various ratios of crystalline and amorphous areas (e.g., varying degrees of atomic order and disorder) that may result in intermediate resistances, which may represent different logic states (e.g., supporting more than two logic states in a respective memory cell 105). Further, in some examples a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceed across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. As discussed in further detail below, the logic state of a memory cell 105 having such a memory element may be set by heating the memory element to a temperature profile over time that supports forming a particular atomic configuration, or combination of atomic configurations. Thus, in some examples, memory cell 105 may include a memory storage element and a selector device. In other examples, the memory cell 105 may be a self-selecting memory cell that includes a single, self-selecting material.

Memory array 100 may be a three-dimensional (3D) memory array, where two-dimensional (2D) memory layers (e.g., "levels") are formed on top of one another. Such an arrangement of layers may increase the number of memory cells 105 that may be formed on a single die or substrate as compared with 2D arrays, which in turn may reduce production costs, or increase the performance of the memory array, or both. According to the example depicted in FIG. 1, memory array 100 includes two levels of memory cells 105 and may thus be considered a 3D memory array. Other examples or a memory array 100 in accordance with the present disclosure may have a single layer, or more than two layers. In some examples each level may be aligned or positioned so that memory cells 105 may be approximately aligned with one another across levels, forming a memory cell stack 145.

In the example of memory array 100, each row of memory cells 105 is connected to one of a plurality of first access lines 110 (e.g., a word line), and each column of memory cells 105 is connected to one of a second plurality of access lines 115 (e.g., a bit line). Access lines 110 and 115 may be substantially perpendicular to one another to create an array of access lines. As shown in FIG. 1, the two memory cells 105 in a memory cell stack 145 may be accessed by separate access lines 110, and share a common access line 115. That is, an access line 115 may be coupled with (e.g., in electronic communication with) the bottom electrode of the upper memory cell 105-*a* and the top electrode of the lower memory cell 105-*b*. Other configurations may be possible. For example, a third layer may share an access line 110 with a lower layer.

In general, one memory cell 105 may be located at the intersection (e.g., coupled between) an access line 110 and an access line 115. This intersection may be referred to as an address of a memory cell 105. A target memory cell 105 may be a memory cell 105 located at the intersection of an energized access line 110 and an energized access line 115. In other words, an access line 110 and an access line 115 may be energized or otherwise selected in order to read or write a memory cell 105 at their intersection. Other memory cells 105 that are in electronic communication with (e.g., connected to) the same access line 110 or 115 may be referred to as untargeted memory cells 105.

In some examples an electrode may be coupled between a memory cell 105 and an access line 110, or between a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory array 100.

Operations such as reading and writing may be performed on memory cells 105 by activating or otherwise selecting access lines 110 and 115. References to word lines, bit lines, digit lines, or their analogues are interchangeable without loss of understanding or operation. Activating or selecting an access line 110 or an access line 115 may include applying a voltage to the respective access line. Access lines 110 and access lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing portion of a cell (e.g., a capacitor or resistive memory element) may be electrically isolated from an access line by a selection component. For example, an access line 110 may be connected to and may control such a selection component (e.g., a selection component of a memory cell 105). In some examples a selection component may be a transistor and an access line 110 may be connected to the gate of the transistor. Activating the access line 110 may therefore cause an electrical connection or closed circuit between the logic storing portion of a memory cell 105 and its corresponding access line 115. The access line 115 may then be accessed to either read or write the memory cell 105. After selecting a memory cell 105, the resulting signal may be used to determine the logic state stored by the memory cell 105. For example, a voltage may be applied to the memory cell 105 and the resulting current may be used to differentiate between atomic configurations (e.g., resistive states) of a phase change material of the memory cell 105. In some cases, a first logic state may correspond to no current or a negligibly small current, whereas a second logic state may correspond to some finite current.

Accessing memory cells 105 may be controlled through a row decoder 120 and a column decoder 130. For example, a row decoder 120 may receive a row address from the memory controller 140 and activate or otherwise select the appropriate access line 110 based on the received row address. Similarly, a column decoder 130 may receive a column address from the memory controller 140 and activate or otherwise select the appropriate access line 115.

The memory controller 140 may control the operation (e.g., read operations, write operations, rewrite operations, refresh operations, or discharge operations) of memory cells 105 through the various components (e.g. row decoder 120, column decoder 130, and sense component 125). In some cases, one or more of the row decoder 120, column decoder 130, and sense component 125 may be co-located with the memory controller 140. Memory controller 140 may generate row and column address signals in order to activate the desired access line 110 and access line 115. Memory controller 140 may also generate or control various voltages or currents used during the operation of memory array 100. For example, the memory controller 140 may apply a discharge voltage to a access line 110 or access line 115 after accessing one or more memory cells 105.

In general, the amplitude, shape, or duration of an applied voltage, current, or charge in accordance with the present disclosure may be adjusted or varied, and may be different for the various operations discussed in operating the memory array 100. Further, one, multiple, or all memory cells 105 within memory array 100 may be accessed simultaneously. For example, multiple or all memory cells 105 of memory array 100 may be accessed simultaneously during a reset operation in which all memory cells 105, or a group of memory cells 105, are set to a single logic state.

A memory cell 105 may be read (e.g., sensed) by sense component 125 when the memory cell 105 is accessed to determine the stored state of the memory cell 105. For example, after accessing the memory cell 105, the logic storage portion of memory cell 105 may discharge, or otherwise permit current to flow via its corresponding access line 115. Such current may result from biasing, or applying a voltage, to the memory cell 105 from one or more voltage sources (not shown) of the memory array 100, where such voltage sources may be part of the sense component 125, or some other component (e.g., a biasing component). In some examples a discharge of a memory cell 105 may cause a change in the voltage of the access line 115, which sense component 125 may compare to a reference voltage in order to determine the stored state of the memory cell 105. In some examples a voltage may be applied to a memory cell 105 (e.g., using the corresponding access line 110 and access line 115) and the presence of a resulting current may depend on the applied voltage and the resistance state of a memory element of the memory cell 105.

In some cases, more than one voltage may be applied when reading a memory cell 105 (e.g., multiple voltages of a read operation). For example, if an applied read voltage does not result in current flow, other read voltages may be applied until a current is detected by sense component 125. By assessing the read voltage that resulted in current flow, the stored logic state of the memory cell 105 may be determined. In some cases, a read voltage may be ramped higher in magnitude until a current flow is detected by sense component 125. In other cases, predetermined read voltages may be applied sequentially until a current is detected. Likewise, a read current may be applied to a memory cell 105 and the magnitude of the voltage to create the read current may depend on the electrical resistance or the total threshold voltage of the memory cell 105.

Sense component 125 may include various transistors or amplifiers in order to detect and amplify a difference in read signals (e.g., a read voltage, a read current, or a read charge shared between components of the memory array 100), which in some examples may be referred to as latching. The sense component 125 may be configured to sense the current or charge through the memory cell 105 responsive to a read operation and provide an output signal indicative of the logic state stored by the memory cell 105. The sense component 125 may be included in a memory device that includes the memory array 100. For example, the sense component 125 may be included with other read and write circuits, decoding circuits, or register circuits of the memory that may be coupled to the memory array 100. In some examples the detected logic state of memory cell 105 may be output through column decoder 130 as output 135. In some examples a sense component 125 may be part of a column decoder 130 or row decoder 120. In some examples a sense component 125 may be connected to or otherwise in electronic communication with column decoder 130 or row decoder 120.

In some examples, when a read pulse (e.g., a read voltage) is applied to a memory cell 105 with a memory element storing a first logic state (e.g., a SET state, associated with a more-crystalline atomic configuration), the memory cell conducts current due to the read pulse exceeding the threshold voltage of the memory cell 105. The sense component 125 may therefore detect a current through the memory cell 105 as part of determining the stored logic state. When a read pulse is applied to the memory cell 105 with the memory element storing a second logic state (e.g., a RESET state, associated with an more-amorphous atomic configuration), the memory cell may not conduct current due to the read pulse not exceeding the threshold voltage of the memory cell. The sense component 125 may therefore detect little or no current through the memory cell 105 as part of determining the stored logic state.

In some examples a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 110 or 115. In some examples, a logic state stored by a memory cell 105 may be determined based on a resulting voltage (e.g., across a shunt resistance) from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some memory architectures, accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the stored logic state. In PCM, for example, sense operations may cause a change in the atomic configuration of a memory cell 105, thereby changing the resistance state of the memory cell 105. Thus, in some examples the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row or all cells of an accessed column) may be rewritten after the access operation.

In some examples reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse in order to maintain the stored logic state. Refreshing the memory cell 105 may reduce or eliminate read disturb errors or logic state corruption due to charge leakage or a change in an atomic configuration of a memory element over time.

A memory cell 105 may be written with a logic state by activating or otherwise selecting the relevant access lines (e.g., an access line 110 and an access line 115). In other words, a logic value may be stored in the memory cell 105 by a write operation via an access line 110 and an access line 115 corresponding to the memory cell 105. Column decoder 130 or row decoder 120 may accept data (e.g., via input/output 135) to be written to the memory cells 105. In the case of PCM, a memory cell 105 may be written by heating the memory element of a memory cell 105 by passing a current through the memory element. The voltages used to apply a current to a memory cell 105 may depend on the various threshold voltages of the memory elements, and in some cases, a threshold voltage associated with a selection component.

In some examples, the memory cell may include a self-selecting memory material. That is, the memory cell may include a single, self-selecting material that may be configured to act as both a selector and as a memory element. In some cases, the self-selecting memory may be or include a chalcogenide material that does not undergo a phase change, as one example. In the case of memory cell including a self-selecting memory, memory cell 105 may be programmed by applying programming pulses of different polarities to the memory cell 105. For example, to program a logic "1" state, a first polarity may be applied and to program a logic "0" state, a second polarity may be applied. The first polarity and the second polarity may be opposite polarities.

To read a memory cell 105 with a self-selecting memory storage element, a voltage may be applied across memory cell 105 and the resulting current or the threshold voltage at which current begins to flow may be representative of a logic "1" or a logic "0" state. In some examples, a threshold voltage of a cell may depending on a polarity used to program the cell. For example, a self-selecting memory cell programmed with one polarity may have certain resistive properties and thus one threshold voltage. And that self-selecting memory cell may be programmed with a different polarity that may result in different resistive properties of the cell and thus a different threshold voltage. Thus, when a self-selecting memory cell is programmed, elements within the cell may separate, causing ion migration. Ions may migrate towards a particular electrode, depending on the given cell's polarity. For example, in a self-selecting memory cell, some ions may migrate towards the negative electrode. The memory cell may then be read by applying a voltage across the cell to sense which electrode ions have migrated towards.

In some cases, more than one voltage may be applied when writing a memory cell 105. For example, when writing a memory element having different atomic configurations associated with different logic states, write voltages may be applied such that heating caused by the related current flowing through the memory cell causes a transition from one atomic configuration to another. In one example, to write a logic state associated with a more-crystalline atomic configuration, a first write voltage of the write operation may be associated with initially forming a disordered atomic configuration (e.g., supporting a relatively high temperature to generally "melt" the material to a relatively random, and sometimes unstable atomic distribution), and a second write voltage of the write operation may be associated with forming a more-crystalline atomic configuration (e.g., supporting a relatively moderate temperature that supports the nucleation and growth of a stable form of the relatively ordered atomic configuration).

A logic state may be written to a memory cell 105 by applying a write voltage to one or both of an associated access line 110 or access line 115. For example, a logic state may be written to a memory cell 105 by applying a write voltage having a first polarity across the memory cell 105 (e.g., a positive polarity). To apply a write voltage having the first polarity, a first voltage (e.g., a positive voltage) may be applied to the associated access line 115, and the associated access line 110 may be grounded or have an otherwise lower or negative voltage. In other examples, a logic state may be written to a memory cell 105 by applying a write voltage having a different polarity across the memory cell 105, such as a negative polarity. To apply a write voltage with this different polarity, a second voltage (e.g., a positive voltage) may be applied to the access line 110 and the access line 115 may be grounded or have an otherwise lower or negative voltage. After writing the memory cell 105, subsequent read voltages may be applied to read the stored state of memory cell 105.

In accordance with examples of the present disclosure, a write operation may be divided into different portions having different voltage polarities across a memory cell 105. In some examples, a logic state may be written to a memory cell 105 by performing a write operation that includes applying a first write voltage having a first polarity across the memory cell 105 and applying a second write voltage having a second polarity across the memory cell 105 that is different from the first polarity (e.g., an opposite polarity). In some examples such a write operation may include applying multiple write voltages to the memory cell 105 via a corresponding access line 110 and a corresponding access line 115 by switching the polarity of voltage application between the access line 110 and the access line 115 during the write operation. In one example a write operation in accordance with the present disclosure may include applying a first write voltage with a voltage at the access line 110 being higher than a voltage at the access line 115 followed by applying a second write voltage with a voltage at the access line 110 being lower than a voltage at the access line 115. In another example a write operation in accordance with the present disclosure may include applying a first write voltage with a voltage at the access line 110 being lower than a voltage at the access line 115 followed by applying a second write voltage with a voltage at the access line 110 being higher than a voltage at the access line 115. Performing a write operation that includes applying at least two write voltages having opposite polarities, or otherwise different polarities, may support a faster write operation than one that includes only write voltages of a same polarity.

After performing a write operation on a memory cell 105 (e.g., a write operation with one or more voltages applied with a single polarity across the memory cell 105, or a write operation with one or more voltages applied with more than one polarity across the memory cell 105), a read operation may be performed to read the stored state of memory cell 105. In some examples, a read operation may include applying different read voltages having different polarities across the memory cell 105. In some examples, the memory cell 105 may be read by applying a first read voltage having a first polarity across the memory cell 105, which may be a positive or negative polarity. In some examples the first read voltage may have a magnitude that is less than a write voltage of a preceding write operation. After applying the first read voltage, the read operation may further include applying a second read voltage having a second polarity across the memory cell 105, different from the first polarity. The second polarity may be an opposite polarity, or an otherwise different polarity than the first polarity. Thus, in some examples, the first polarity may be a positive polarity across the memory cell 105 may be a positive polarity and the second polarity may be a negative polarity. In other examples, the first polarity across the memory cell 105 may be a negative polarity and the second polarity may be a positive polarity. Performing a read operation that includes applying at least two read voltages having opposite polarities, or otherwise different polarities, may support a reduced shift of the voltage distribution across the memory cell 105 as compared with a read operation that includes only read voltages of a same polarity.

In some examples the memory controller 140 may be operable to apply the read and write voltages as described above (e.g., by enabling access lines 110 or 115, or otherwise coupling one or more voltage sources with the memory cell 105). For example, memory controller 140 may be operable to perform a write operation including write voltages of differing polarities. Stated alternatively, the memory controller 140 may be operable to first apply a first write voltage having a first polarity to the memory cell 105, and subsequently apply a second write voltage having a second polarity (e.g., opposite from the first polarity) to the memory cell 105 after applying the first write voltage. In some examples the memory controller 140 may be operable to perform a read operation including read voltages of differing polarities. Stated alternatively, the memory controller 140 may be operable to first apply a first read voltage having a first polarity to the memory cell 105, and subsequently apply a second read voltage having a second polarity (e.g., opposite from the first polarity) to the memory cell 105 after applying the first read voltage. The application of the read voltages of different polarities by the memory controller 140 may facilitate the sense component 125 determining a logic state of the memory cell 105 based at least in part on the application of the voltages of different polarities. In some examples, the memory controller 140 may activate, or send an indication to, sense component 125 to determine the logic state of the memory cell 105.

In various examples in accordance with the present disclosure, different access lines or different voltage sources may be used to support read or write operation having different voltage polarities. For example, a third access line (not shown) may be coupled to the memory cell 105 such that a first voltage of a read or write operation is applied in a first direction through the memory cell and a second voltage of the read or write operation is applied in a second, different direction (e.g., an orthogonal direction). Accordingly, applying voltages having different polarities in accordance with the present disclosure need not be limited to opposite polarities. Rather, in some examples applying such voltages may refer more broadly to electric fields being applied to a memory cell 105 in different directions of a 2D or 3D coordinate system.

Figure 2:
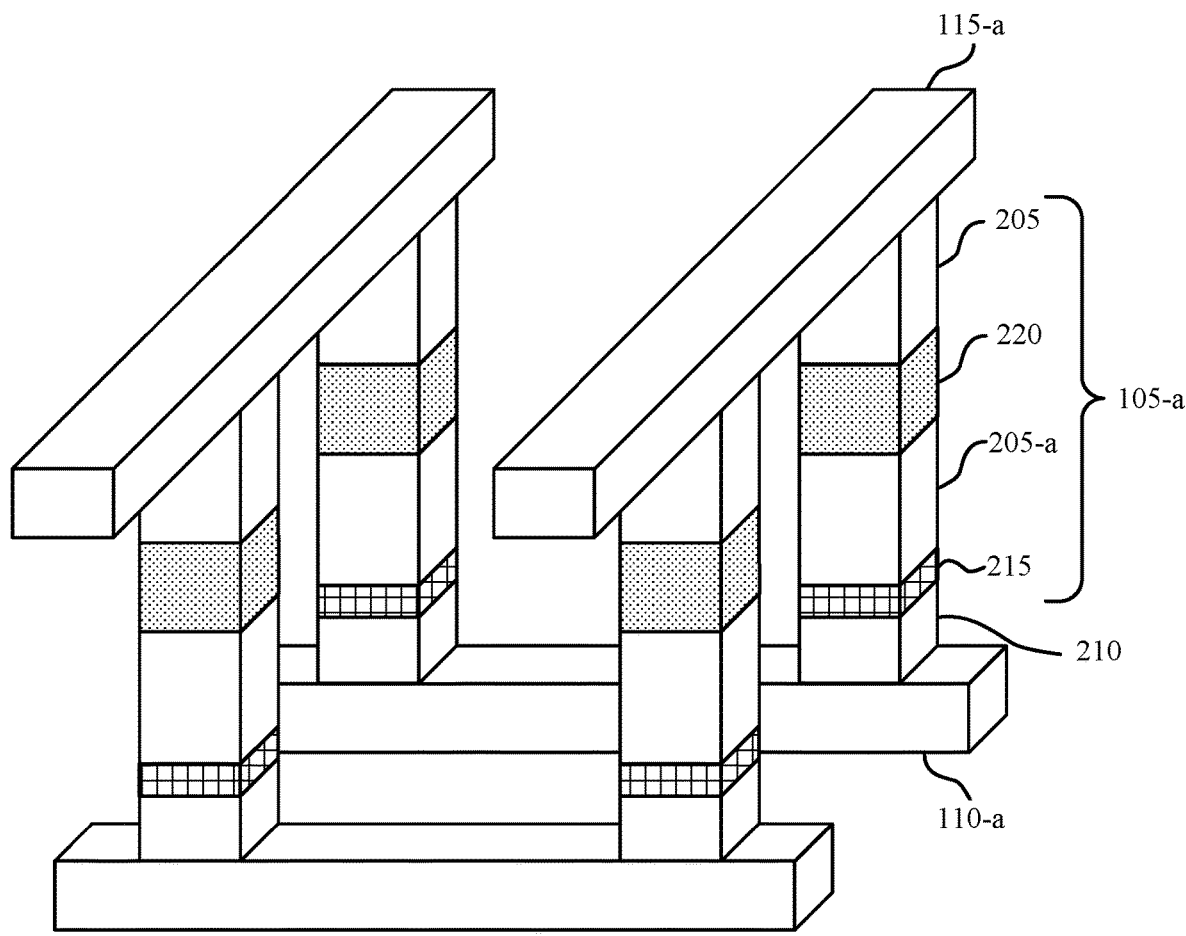
FIG. 2 illustrates an example memory array that supports drift mitigation with embedded refresh in accordance with examples of the present disclosure.

FIG. 2 illustrates an example memory array 200 in accordance with various examples of the present disclosure. Memory array 200 may be an example of memory array 100 with reference to FIG. 1. Memory array 200 includes a plurality of memory cells (e.g., memory cell 105-*a*), a plurality of access lines 110 (e.g., access line 110-*a*), and a plurality of access lines 110 (e.g., access line 115-*a*), which may be examples of memory cells 105, access lines 110, and access line 115 described with reference to FIG. 1. In some cases, a 3D memory array may be formed by stacking multiple memory arrays 200 on one another. The two stacked arrays may, in some examples, have common conductive lines such that each level may share access lines 110 or access lines 115 as described with reference to FIG. 1.

In the example of memory array 200, memory cell 105-*a* includes a memory element 220 which may be an example of a phase change memory element as described herein. Memory cell 105-*a* also includes a first electrode 205-*a* (e.g., coupled between the memory element 220 and the access line 115-*a*), which may be referred to as a top electrode, and a second electrode 205-*b* (e.g., coupled between the memory element 220 and the access line 110-*a*), which may be referred to as a bottom electrode. In some examples, the memory cell 105-*a* may also include a selector device 215. In such examples the memory cell 105-*a* may include an electrode 205-*c* (e.g., coupled between the memory element 220 and the selector device 215), which may be referred to as a middle electrode. In other examples (not shown) the memory cell 105-*a* may include a self-selecting memory between a bottom electrode and a top electrode, respectively. The memory cell 105-*a* may be coupled between the self-selecting memory and one of access lines 110-*a* or 115-*a*.

In accordance with examples of the present disclosure, a logic state may be stored by the memory cell 105-*a* by configuring the atomic configuration (e.g., the electrical resistance) of memory element 220. In some cases, this configuring may include passing a current associated with a write operation through the memory cell 105-*a* to heat the memory cell 105-*a* (e.g., heating the memory element 220), which may wholly or partially form a different atomic configuration (e.g., forming an amorphous phase, or forming a crystalline phase, or forming a combination of an amorphous and crystalline phase) in the memory element 220.

Memory array 200 may be referred to as a cross-point architecture. It may also be referred to as a pillar structure, where a pillar may be in contact with a first conductive line (e.g., access line 110-*a*) and a second conductive line (e.g., access line 115-*a*). For example, as shown in FIG. 2, a pillar may include the second electrode 210 (e.g., a bottom electrode), the selector device 215, the third electrode 205-*a* (e.g., a middle electrode), the memory element 220, and the first electrode 205 (e.g., a top electrode). Such a pillar architecture may offer relatively high-density data storage with lower production costs compared to other memory architectures.

In some examples, access line 110-*a* and access line 115-*a* may be maintained at an inhibit voltage (e.g., a voltage that prevents or otherwise limits memory cell discharge) prior to accessing memory cell 105-*a*. For instance, both the access line 110-*a* and access line 115-*a* may be maintained at an inhibit voltage that is equivalent to a ground or virtual ground (e.g., access line 110-*a* and access line 115-*a* may be coupled with a ground voltage source, or virtual ground voltage source). To access memory cell 105-*a*, one or both of the access line 110-*a* or the access line 115-*a* may be energized by applying an voltage to them, and the resulting voltage applied to target memory cell 105-*a* may be referred to as a cell access voltage. In some examples access voltages applied to access line 110-*a* and access line 115-*a* may have opposite polarities as compared to the ground or virtual ground, such that the magnitude of voltages applied to the access line 110-*a* and access line 115-*a* are additive across the memory cell 105-*a*.

In some examples a write voltage may be applied to memory cell 105-*a* by applying a voltage to one or both of the access line 110-*a* or the access line 115-*a*. The write voltage may be applied with a positive polarity or a negative polarity across the memory cell 105-*a*. For example, when applying a write voltage with a positive polarity, a positive voltage may be applied to the access line 115-*a* and the access line 110-*a* may be grounded or otherwise lower than the positive voltage applied to the access line 115-*a*. When applying a write voltage with a negative polarity, a positive voltage may be applied to the access line 110-*a* and the access line 115-*a* may be grounded or otherwise lower than the positive voltage applied to the access line 110-*a*.

In some examples, an inhibit voltage may be an intermediate voltage (e.g., a mid-bias voltage). In some examples, instead of applying a positive access line access voltage and a negative access line access voltage relative to a virtual ground, a voltage may be applied to an access line 110 or 115 relative to such an intermediate voltage. For instance, the memory array 200 may be operated using only a positive voltage source (e.g., with reference to ground or virtual ground), and the intermediate voltage may be between the positive voltage source and a ground or virtual ground.

In some examples, voltages applied to an access line 110 or 115 may be maintained at the intermediate voltage prior to an access operation of memory cell 105-*a*. During an example access operation, a voltage applied to the access line 115-*a* may be increased (e.g., to a positive supply rail) while a voltage applied to the access line 110-*a* may be decreased (e.g., to a virtual ground), generating a voltage across memory cell 105-*a* (e.g., with a positive polarity).

A selector device 215 may, in some cases, be connected in series between a memory element 220 and a conductive line (e.g., at least one of the access line 110-*a* or the access line 115-*a*). For example, as depicted in memory array 200, the selector device 215 is located between the second electrode 205-*b* (e.g., a bottom electrode) and the third electrode 205-*c* (e.g., a middle electrode). Thus, the selector device 215 is located in series between (e.g., coupled between) the memory element 220 and the access line 110-*a*. Other configurations are possible. For example, a selector device 215 may be located in series between the memory element 220 and the access line 115-*a*. In other examples a selector device 215 may not be part of a memory cell 105, but may otherwise be coupled between a memory cell 105 and an access line (e.g., access line 110 or 115).

A selector device 215 may aid in selecting a particular memory cell 105, or may help prevent stray currents from flowing through non-selected memory cells 105 adjacent a selected memory cell 105. A selector device 215 may also reduce the bias (e.g., voltage) across untargeted memory cells 105. For example, a selector device 215 may have a threshold voltage such that a current flows through selector device 215 when the threshold voltage is met or exceeded.

A selector device 215 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal selecting components such as a diode. In some cases, a selector device 215 includes a chalcogenide film, for example, an alloy of selenium (Se), arsenic (As), and germanium (Ge). A selector device 215 may be physically separated from a memory element 220 by an electrode such as the third electrode 205-c. As such, the third electrode 205-c may electrically float—that is, charge may accumulate at the third electrode 205-c because it may not be directly connected to an electrical ground or virtual ground, or other component capable of being electrically grounded.

The memory array 200 may be formed by various combinations of material formation and removal (e.g., additive and subtractive operations). For example, layers of material may be deposited that correspond to the access lines 110 or 115, electrodes 205, selector devices 215, or memory elements 220. Material may be selectively removed to then create the desired features, such as the pillar structure depicted in the memory array 200. For example, features may be defined using photolithography to pattern a photoresist and then material may be removed by techniques such as etching. Access lines 115 may then be formed, for example, by depositing a layer of material and selectively etching to form the line structure depicted in the memory array 200. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of the memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As discussed above, memory cells 105 of the memory array 200 may include a memory element 220 associated with a configurable atomic configuration (e.g., a configurable resistance). Materials that support a configurable resistance may include, for example, metal oxides, chalcogenides, and the like. Chalcogenide materials are materials or alloys that include at least one of the elements sulfur (S), tellurium (Te), or selenium (Se). Many chalcogenide alloys may be used to support the configurable resistance of a memory element 220. For example, a memory element 220 may include a germanium-antimony-tellurium alloy (Ge—Sb—Te). Other chalcogenide alloys not expressly recited here may also be employed in a memory element 220.

PCM systems may exploit a relatively large difference in resistance between atomic configurations (e.g., between a more-crystalline state and a more-amorphous state) in certain phase change materials. For example, such materials in the crystalline state may have atoms arranged in a relatively ordered periodic structure, which may be associated with a relatively low electrical resistance (e.g., in a SET state). By contrast, such materials in an amorphous state may have no or relatively little periodic atomic structure (e.g., a relatively random atomic structure), which may be associated with a relatively high electrical resistance (e.g., in a RESET state).

The difference in electrical resistance between a more-amorphous state and a more-crystalline state of a material may be significant. For example, a material in an amorphous state may have a resistance that is one or more orders of magnitude greater than the resistance of the material in its crystalline state. In some cases, an amorphous state may be associated with a threshold voltage, such that electrical current may not flow through the material until the threshold voltage is exceeded. In some cases, a material may have a distribution of amorphous portions and crystalline portions, and the resistance of the material may be between the resistance associated with a wholly crystalline state and the resistance associated with the wholly amorphous state. In some examples a material may be used for storage applications other than binary storage applications (e.g., the number of possible logic states stored in a material may be more than two).

To write a particular logic state to a memory cell 105-a, a memory element 220 may be heated in manner to preferentially form a particular atomic configuration, or combination of atomic configurations, associated with the particular logic state. In some examples such heating may be provided by passing an electric current through the memory cell 105-a. Heating caused by electrical current flowing through a finite resistance may be referred to as Joule or ohmic heating. Joule heating in a memory cell 105-a may thus be related to the electrical resistance of electrodes 205, a memory element 220, a selector device 215, or various combinations thereof. In other examples, memory element 220 may be heated by means other than Joule heating (e.g., by using a laser or other radiation, friction, or acoustic vibrations).

The atomic configuration formed in the material of a memory element 220 may be related to the temperature of the material over time through a write operation. For example, to set a high-resistance state (e.g., a RESET state) associated with a more-amorphous atomic configuration, the material may first be heated to a temperature higher than a temperature associated with forming the amorphous state of the material, which may be referred to as a melting temperature or a critical temperature. When the material is above the melting temperature or critical temperature, the material may be in a relatively disordered atomic configuration. In order to maintain the disordered atomic configuration after a write operation is completed, the heating that was applied to the memory element 220 may be removed relatively quickly, such that the temperature of the material drops relatively quickly. Thus, the elements of the material may not have sufficient time to become substantially ordered (e.g., lacking time to substantially crystallize), and the material may be relatively "locked" or "frozen" in the disordered configuration associated with the more-amorphous state. As used herein, a "more-amorphous" state or atomic configuration may refer to an entirely amorphous state, or a substantially amorphous state that has relatively little crystallinity (e.g., relatively few, and/or relatively small portions of the material element having atomic periodicity).

In some examples the current applied to the memory element 220 in a RESET operation may be associated with, or otherwise referred to as a "RESET pulse," and removing the RESET pulse may cause sufficiently rapid cooling in the memory element 220 to form the more-amorphous state in the 220. Thus, in some examples, a write operation for a RESET state may include a single RESET pulse (e.g., a single write current or voltage application), without a subsequent write pulse of the write operation.

In another example, to set a low-resistance state (e.g., a SET state) associated with a more-crystalline atomic configuration, the material may also be first heated to a temperature higher than the temperature associated with forming the amorphous state of the material (e.g., the melting temperature or critical temperature). In order to form a more-ordered atomic configuration (e.g., a more-crystalline state), the heating applied to the memory element 220 may be removed relatively slowly, such that the temperature of the material drops relatively slowly. The relatively slow cooling may support the formation of a relatively ordered state of the elements of the material, which may be referred to as a "nucleation" and "growth" of a crystalline phase, or simply "crystallization." In other words, with a relatively slow cooling from the elevated temperature associated with forming the disordered state, the more-crystalline state may be formed in a memory element 220 to write the low-resistance state. As used herein, a "more-crystalline" state or atomic configuration may refer to an entirely crystalline state (e.g., a single crystal), or a substantially crystalline state that has relatively substantial crystallinity (e.g., relatively large portions of the material element having atomic periodicity).

Depending on the rate of cooling, nucleation of the crystalline atomic structure may occur at relatively more or fewer portions of a memory element 220, which may cause the memory element to form discrete portions of crystalline material which may be referred to as "grains." In some examples, the relative size of such grains and/or the relative number of grains throughout a memory element 220 may contribute to different levels of resistance in a memory element 220. In some examples, such granularity of a crystalline atomic configuration may be specifically configured to support more than two logic states in a memory element.

In some examples the initial current applied to the memory element 220 in a SET operation may also be associated with, or otherwise referred to as a "RESET pulse" (e.g., the same pulse applied in a RESET write operation). However, in a SET operation the RESET pulse may be followed by a subsequent application of current or voltage across the memory element 220 that may be associated with, or otherwise referred to as a "SET pulse," where the SET pulse may support cooling of the memory element 220 that is sufficiently slow to form the more-crystalline state in the memory element 220. Thus, in some examples, a write operation for a SET state may include a RESET pulse (e.g., a single write current or voltage application) and also include a subsequent SET pulse.

The current flowing through a memory element 220 to support such heating and cooling profiles may result from applying a voltage to memory cell 105-*a* (e.g., via an access line 110 and an access line 115). In some examples the applied voltage may be based on the threshold voltage of the memory element 220, the threshold voltage of selector device 215, or combinations thereof. For example, if a memory element 220 is in a RESET state, current may not flow through memory cell 105-*a* unless the applied voltage is greater than the sum of the threshold voltages of selector device 215 and the memory element 220.

After applying a write voltage (e.g., a RESET pulse, or a RESET pulse and a SET pulse), the memory cell 105-*a* may be read by applying a read voltage to the memory cell 105-*a*. Like applying the write voltage, the application of the read voltage may result in current flowing across the memory cell 105-*a*. The magnitude of the current may depend on the resistance of the memory element 220 (e.g., as written to a more-amorphous state or as written to a more-crystalline state), and accordingly the magnitude of the current may be used to determine a logic state stored by the memory cell 105-*a*.

Figure 3:
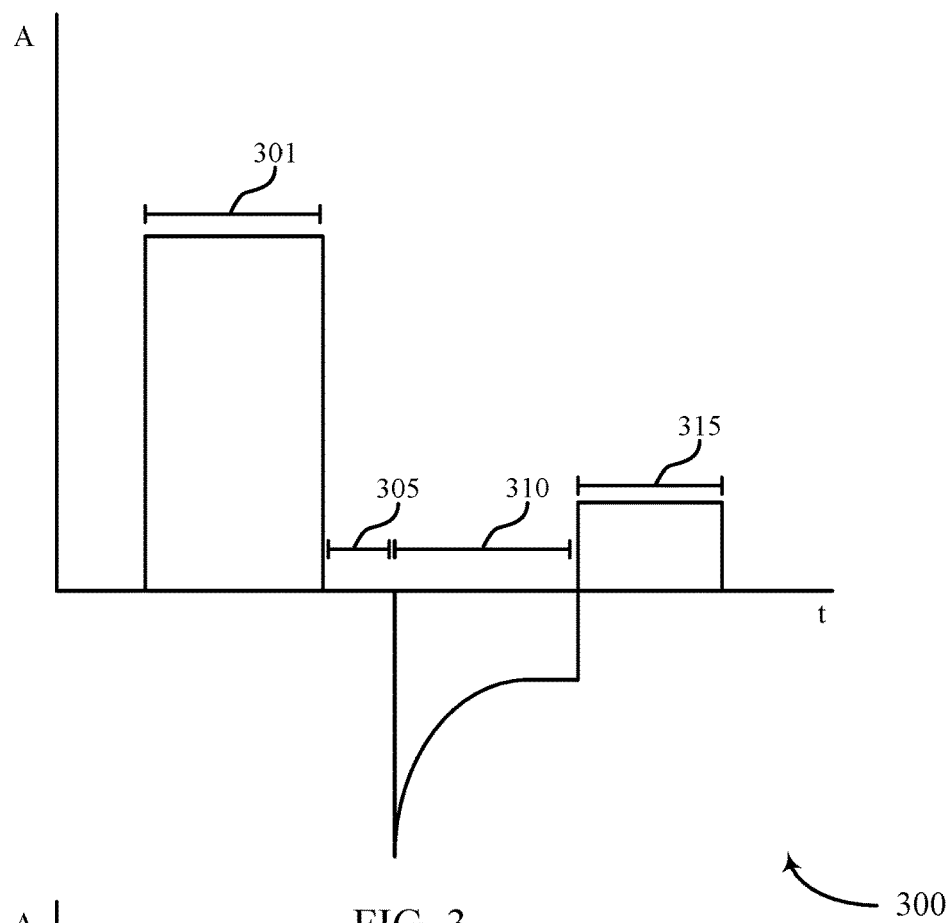
FIGS. 3 through 5 illustrate example timing diagrams that support drift mitigation with embedded refresh in accordance with examples of the present disclosure.

FIG. 3 illustrates an example of a timing diagram 300 that supports drift mitigation with embedded refresh in accordance with various examples of the present disclosure. The timing diagram 300 may include a horizontal axis that represents time, and a vertical axis that represents electrical current across a memory cell (e.g., memory cell 105-*a* as described with reference to FIG. 2). The timing diagram 300 may also include a duration 301 associated with a write operation, a duration 310 associated with a sense operation, and a duration 315 associated with a setback operation, where the duration 310 and the duration 315 may collectively be associated with a read operation. In some examples, a write voltage or current associated with duration 301 may be referred to as a write pulse, a sense voltage or current associated with duration 310 may be referred to as a sense pulse, and a setback voltage or current associated with duration 315 may be referred to as a setback pulse. In other examples, a sense voltage or current may be referred to as a first read voltage, a first read current, or a first read pulse of a read operation, and a setback voltage may be referred to as a second read voltage, a second read current, or a second read pulse of the read operation.

The memory cell, in some examples, may include a memory element (e.g., a memory element 220 as described with reference to FIG. 2), and may be coupled with a first access line (e.g., an access line 110 as described with reference to FIGS. 1 and 2) and a second access line (e.g., an access line 115 as described with reference to FIGS. 1 and 2). In some examples the memory cell may further include a selector device (e.g., selector device 215 as described with reference to FIG. 2). In other examples, the memory cell may include a self-selecting memory, as described above with reference to FIGS. 1 and 2.

A logic state may be written to the memory cell by applying a write voltage across the memory cell during the duration 301, which may be applied via the first access line and the second access line. The write voltage during the duration 301 may drive a current through the memory cell, which may result in configuring the memory element of the memory cell with a more-crystalline state, a more-amorphous state, or some combination thereof. The composition of the memory element (e.g., the degree of amorphousness and/or crystallinity or the degree of granularity of crystal grains) may correspond to different logic states (e.g., a logic 1 or a logic 0).

The direction of current flow through the memory cell may depend on the polarity of the write voltage applied during the duration 301. For example, to write to the memory cell with a positive current (e.g., as depicted in timing diagram 300), a voltage with a positive polarity may be applied across the memory cell by applying a maximum write voltage (e.g., $V_{MAX}$) to the second access line during the duration 301, and a ground or virtual ground voltage to the first access line, or some other relatively lower voltage to the first access line. Accordingly, the write voltage having a positive polarity across the memory cell may result in a positive current flowing across the memory cell. In some examples, after applying the write voltage during the duration 301, the write voltage may be removed during the duration 305. Stated alternatively, no net voltage may be applied across the memory cell during the duration 305. In other examples a read operation may proceed directly from the duration 305 to the duration 310 (e.g., without a duration of zero voltage applied across the memory cell)

The memory cell may be subsequently read (e.g., sensed) by applying a first read voltage (e.g., a sense voltage) during the duration 310. The first read voltage may have a first polarity across the memory cell and, in some instances, the first polarity may be an opposite or otherwise different polarity across the memory cell as compared with the polarity of the write voltage during the duration 310. For example, a depicted in FIG. 3, the first read voltage may be applied with a negative polarity across the memory cell, which may be opposite from the positive polarity during the duration 301. To apply the first read voltage with a negative polarity across the memory cell, a maximum read voltage (e.g., $V_{MAX}$) may be applied to the first access line, and the second access line may be grounded. In other examples (not shown), the first read voltage may not have a different polarity than a preceding write voltage. For example, in another embodiment the first read voltage may be applied with a positive polarity by applying $V_{MAX}$ to the second access line, and grounding the first access line. In either example, the voltage applied across the memory cell may result in a current across the memory cell. The current across the memory cell resulting from the first read voltage during the duration 310, as depicted in FIG. 3, may be indicative of a particular logic state stored by the memory cell.

During the application of the first read voltage during duration 310, a sense amplifier or a sense component (e.g., sense component 125 as described with reference to FIG. 1) may be activated. During the period of activation, the sense amplifier may detect and amplify a difference in the read voltage applied across the memory cell, which may be referred to as latching. Accordingly, the logic state stored by the memory cell may be determined based at least in part on applying the first read voltage across the memory cell 105 (e.g., during the duration 310).

In some examples, a second read voltage may be applied across the memory cell 105 during the duration 315 (e.g., after determining the logic state of the memory cell 105). The second read voltage may be applied across the memory cell with a second polarity that is different form the first polarity. For example, as depicted in FIG. 3, the second read voltage may be applied with a positive polarity, opposite from the polarity of the first read voltage applied during the duration 310. In various examples the second read voltage applied during the duration 315 may have the same polarity as a write voltage applied during the duration 301, or a different polarity from a write voltage applied during the duration 301. A magnitude of the second read voltage may be different than a magnitude of the write voltage. For example, a magnitude of the second read voltage applied across the memory cell during the duration 315 may be less than a magnitude of the write voltage applied across the memory cell during the duration 301.

The duration 315 may be associated with a refresh operation of the memory cell 105. In some examples, the second read voltage may be referred to as a setback voltage, and may result in a current across the memory cell. The current may, in some examples, reintroduce or otherwise refresh the original state of the memory cell. For example, the application of the setback voltage during the duration 315 may revert the memory cell back to a same more-amorphous or more-crystalline state as before the first read voltage is applied during the duration 310. For example, the memory cell may revert back to a same more-crystalline or more-amorphous state as was formed by the application of the write voltage during the duration 301. By reverting the memory cell to its previously-written state as before the first read voltage was applied (e.g., the more-amorphous state or the more-crystalline state), any shift in the atomic configuration (e.g., composition of amorphous or crystalline regions or crystalline granularity) of the memory cell (e.g., drift) caused by applying the first read voltage may be mitigated. Stated differently, by applying the first read voltage with an opposite polarity as the write voltage, the voltage distribution of memory cell may shift due to inverse polarity effects of the read voltage. Thus, the application of the second voltage may refresh (e.g., "snap back") the distribution of the memory cell to similar state post-write-operation. In some examples, the second read voltage may be applied with a positive polarity, opposite from the first read voltage applied during the duration 310. As described above, the memory cell may include a self-selecting memory, thus duration 315 may be associated with a refresh operation.

By reverting the cell back to its original amorphous or crystalline state as after the first read voltage was applied, any shift in the voltage distribution of the memory cell (e.g., drift) caused by applying the first read voltage may be mitigated. Stated alternatively, by applying the first read voltage with an opposite polarity as the write voltage, the voltage distribution of memory cell may shift due to inverse polarity effects of the read voltage. Thus, the application of the second voltage may refresh (e.g., "snap back") the distribution of the memory cell to similar state post-write-operation.

In another example (not shown), the polarities of the write and read voltages across the memory cell may be reversed as would be understood by a person of ordinary skill in the art. For example, the write voltage may be applied with a negative polarity across the memory cell, which may be accompanied by applying the first read voltage with a positive polarity, and applying the second read voltage with a negative polarity. In such an example, the same benefits (e.g., mitigating shifting of the voltage distribution of the memory cell) may be realized as were described above with reference to alternative examples.

Although the write voltage applied during duration 301 is illustrated as a step change in voltage, various examples of a write operation (e.g., a polarity-conditioned memory cell write operation) may include applying one or more voltages with different profiles over time. For example, the write voltage may be applied as a step change in voltage, a rectangular or square change in voltage, a ramped change in voltage, a triangular change in voltage, a linear or non-linear change in voltage, an exponential change in voltage, a logarithmic change in voltage, some combination of different changes in voltage, or any other profile.

Further, the voltages illustrated by the timing diagram 300 may refer to various portions of a circuit that includes a memory cell (e.g., memory cell 105 as described with reference to FIG. 1). For example, the illustrated voltages may refer to voltages across the terminals of a memory cell, across the memory element (e.g., memory element 220 as described with reference to FIG. 2) of a memory cell, between electrodes (e.g., electrode 205 as described with reference to FIG. 2) of a memory cell, between a location of a first access line (e.g., an access line 115 as described with reference to FIG. 1) and a location of a second access line (e.g., an access line 110 as described with reference to FIG. 1), or source voltages coupled with a memory cell (e.g., a difference between two voltage sources in electronic communication with the memory cell).

Figure 4:
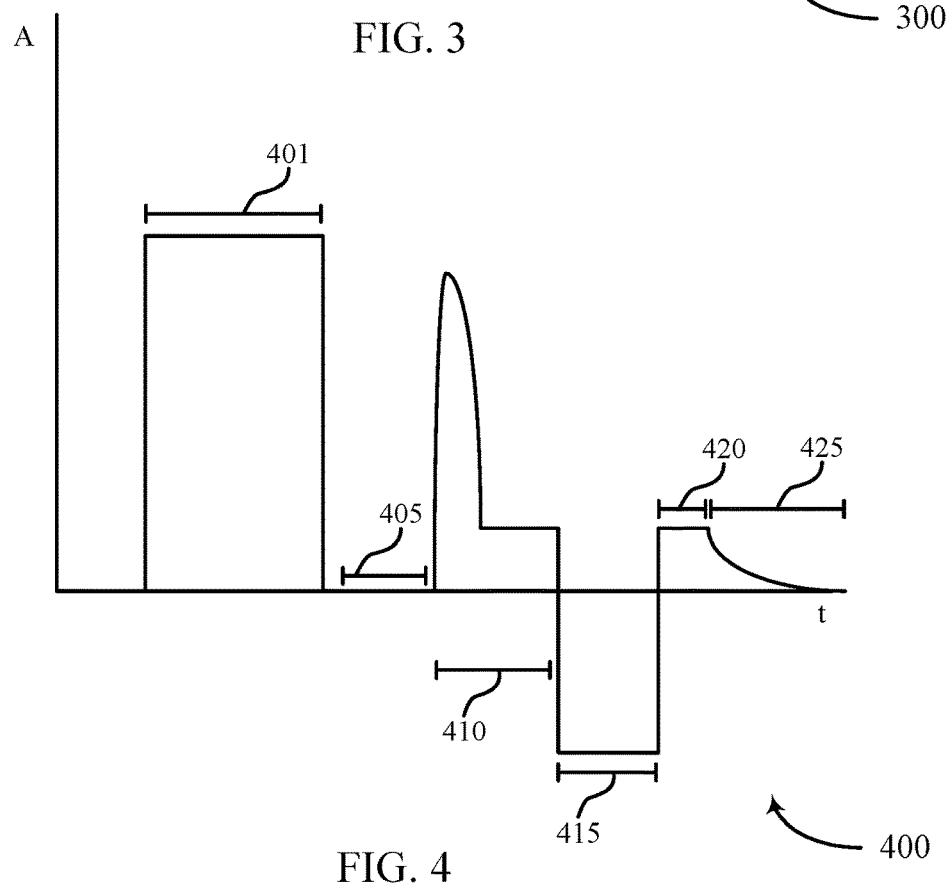

FIG. 4 illustrates an example of a timing diagram 400 that supports drift mitigation with embedded refresh in accordance with various examples of the present disclosure. The timing diagram 400 may include a horizontal (e.g., "X") axis that represents time, and a vertical (e.g., "Y") axis that represents a resulting current across a memory cell (e.g., memory cell 105-a as described with reference to FIG. 2).

The timing diagram 400 may also include a write voltage during duration 401, which may be an example of a write voltage during duration 301 as described with reference to FIG. 3; a sense voltage during duration 410, which may be an example of sense voltage during duration 310 as described with reference to FIG. 3; a growth voltage during duration 415; a setback voltage during duration 420, which may be an example of setback voltage during duration 315 as described with reference to FIG. 3; and a bit line voltage during duration 425.

In some examples, the write voltage during duration 401 may be referred to as a write pulse, the sense voltage during duration 410 may be referred to as a sense pulse, the growth voltage during duration 415 may be referred to as a growth pulse, and the setback voltage during duration 420 may be referred to as a setback pulse. In other examples, the sense voltage may be referred to as a first read voltage or a first read pulse, the growth voltage may be referred to as a second read voltage or a second read pulse, and the setback voltage may be referred to as a third read voltage or a third read pulse.

A memory cell (e.g., memory cell 105-a as described with reference to FIG. 2) may be written to by applying a write voltage during duration 401. The memory cell, in some examples, may include a memory element (e.g., memory element 220 as described with reference to FIG. 2) and a selector device (e.g., selector device 215 as described with reference to FIG. 2), and may be coupled with a first access line (e.g., word line 110-a as described with reference to FIG. 2) and a second access line (e.g., digit line 115-a as described with reference to FIG. 2).

During duration 401 a write voltage may be applied to one of the first access line or the second access line—depending on a polarity of the write voltage—which may result in the memory cell having a combination of crystalline and/or amorphous areas. The composition of the memory cell—the composition of the amorphousness and/or crystalline nature of the cell—may correspond to different logic states (e.g., a logic "1" or a logic "0"). To write to the memory cell with a positive polarity, as depicted in FIG. 4, a maximum write voltage (e.g., $V_{MAX}$) may be applied to the second access line during duration 401, and the first access line may be grounded. The voltage applied to the second access line may result in a current across the memory cell, which may alter the composition (e.g., the amorphousness or the crystalline nature) of the memory cell. In some examples, after applying the write voltage during duration 401, the write voltage may be removed during duration 405. Stated alternatively, no voltage may be applied to the memory cell during duration 405.

In some examples, the memory cell may be subsequently read (e.g., sensed) by applying a first read voltage during duration 410. The first read voltage may have a first polarity and, in some instances, the first polarity may be a same polarity than the polarity of the write voltage. For example, a depicted in FIG. 4, the write voltage may be applied with a positive polarity and the first read voltage may also be applied with a positive polarity. In other examples (not shown), the first write voltage and the first read voltage may be applied with opposite polarities. To apply the first read voltage with a negative polarity, a maximum read voltage (e.g., $V_{MAX}$) may be applied to the first access line, and the second access line may be grounded. In other examples (not shown), the first read voltage may be applied with a positive polarity by applying $V_{MAX}$ to the second access line, and grounding the first access line. In either example, the applied voltage may result in a current across the memory cell. Thus the increase in current across the memory cell, as depicted in FIG. 4, may be indicative of a particular logic state of the memory cell.

During the application of the first read voltage during duration 410, a sense amplifier or a sense component (e.g., sense component 125 as described with reference to FIG. 1) may be activated. During the period of activation, the sense amplifier may detect and amplify a difference in the read voltage applied across the memory cell, which may be referred to as latching. Subsequently, for example, the logic state of the memory cell may be determined based at least in part on applying the first read voltage. After determining the logic state of the memory cell, a second read voltage may be applied during duration 415.

In some examples, a second read voltage may be applied during duration 415. The second read voltage may, for example, be applied to the memory cell with a second polarity that is different form the first polarity. For example, as depicted in FIG. 4, the write voltage may be applied with a positive polarity, the first read voltage may be applied with a positive polarity, and the second read voltage may be applied with a negative polarity. In some examples, a magnitude of the first read voltage and the second read voltage may each be different—or in the example of FIG. 4, lesser—than a magnitude of the write voltage.

During duration 415, a refresh operation of the memory cell may begin. In some examples, the second read voltage may be referred to as a growth voltage, which may result in a current across the memory cell. The current may, in some examples, begin transitioning the state of the memory cell from a more-amorphous state to a more-crystalline state. For example, during the application of the first read pulse, the composition of the memory cell may become more amorphous. Thus, by applying the second read voltage, the composition of the memory cell may shift back from more amorphous to more crystalline. By applying the second read voltage with an opposite polarity of the first read voltage, the memory cell may more-effectively transition from an amorphous phase to a crystalline phase. In some examples, the second read voltage may be applied with a positive polarity, opposite from the first read voltage applied during the duration 410. As described above, the memory cell may include a self-selecting memory, thus duration 415 may be associated with a refresh operation.

During duration 420, the refresh operation of the memory cell may continue. For example, during duration 420, a third read voltage having the first polarity may be applied to the memory cell. Stated alternatively, during duration 420, a third read voltage having the first polarity may be applied to the memory cell after applying the second read voltage, and applying the third read voltage may be associated with the refresh operation of the memory cell. In some examples, the third read voltage may be referred to as a setback voltage, which may reintroduce the original state of the memory cell. For example, the setback voltage may revert the memory cell back to a same amorphous or crystalline state as after the first read voltage was applied. The setback voltage may also improve a crystalline state of the memory cell and reintroduce the original state of a selector device of the memory cell.

By reverting the cell back to its original amorphous or crystalline state as after the first read voltage was applied, any shift in the voltage distribution of the memory cell (e.g., drift) caused by applying the first read voltage may be mitigated. Stated alternatively, by applying the first read voltage with an opposite polarity as the write voltage, the voltage distribution of memory cell may shift due to inverse polarity effects of the read voltage. Thus, the application of the second voltage may refresh (e.g., "snap back") the distribution of the memory cell to similar state post-write-operation. In some examples, during duration 425, the second access line may be grounded, resulting in the removal any current across the memory cell (e.g., the current returning to 0 A).

In another example (not shown), the polarities of the write and read voltages may be reversed as would be understood by a person of ordinary skill in the art. For example, the write voltage may be applied with a negative polarity, resulting in the first read voltage being applied with a negative polarity, the second read voltage being applied with a positive polarity, and the third read voltage being applied with a negative polarity. In such an example, the same benefits (e.g., mitigating shifting of the voltage distribution of the memory cell) may be realized as were described above with reference to alternative examples.

Although the write voltage applied during duration 401 is illustrated as a step change in voltage, various examples of a write operation (e.g., a polarity-conditioned memory cell write operation) may include applying one or more voltages with different profiles over time. For example, the write voltage may be applied as a step change in voltage, a rectangular or square change in voltage, a ramped change in voltage, a triangular change in voltage, a linear or non-linear change in voltage, an exponential change in voltage, a logarithmic change in voltage, some combination of different changes in voltage, or any other profile.

Further, the voltages illustrated by the timing diagram 400 may refer to various portions of a circuit that includes a memory cell (e.g., memory cell 105 as described with reference to FIG. 1). For example, the illustrated voltages may refer to voltages across the terminals of a memory cell, across the memory element (e.g., memory element 220 as described with reference to FIG. 2) of a memory cell, between electrodes (e.g., electrode 205 as described with reference to FIG. 2) of a memory cell, between a location of a first access line (e.g., an access line 115 as described with reference to FIG. 1) and a location of a second access line (e.g., an access line 110 as described with reference to FIG. 1), or source voltages coupled with a memory cell (e.g., a difference between two voltage sources in electronic communication with the memory cell).

Figure 5:
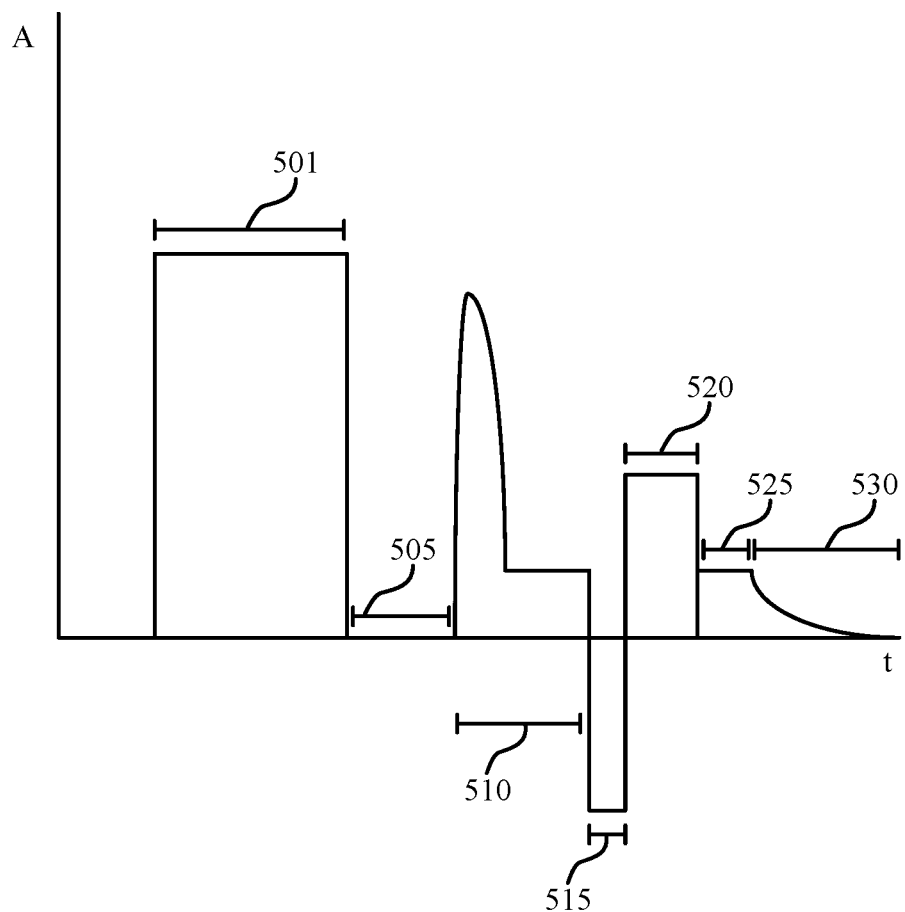

FIG. 5 illustrates an example of a timing diagram 500 that supports drift mitigation with embedded refresh in accordance with various examples of the present disclosure. The timing diagram 500 may include a horizontal (e.g., "X") axis that represents time, and a vertical (e.g., "Y") axis that represents a resulting current across a memory cell (e.g., memory cell 105-a as described with reference to FIG. 2). The timing diagram 500 may also include a write voltage during duration 501, which may be an example of a write voltage during duration 401 as described with reference to FIG. 4; a sense voltage during duration 510, which may be an example of a sense voltage during duration 410 as described with reference to FIG. 4; an intermediate voltage during duration 515; a growth voltage during duration 520, which may be an example of a growth voltage during duration 415 as described with reference to FIG. 4; a setback voltage during duration 525, which may be an example of a setback voltage during duration 420 as described with reference to FIG. 4; and a bit line voltage during duration 530, which may be an example of a bit line voltage during duration 425 as described with reference to FIG. 4.

In some examples, the write voltage during duration 501 may be referred to as a write pulse, the sense voltage during duration 510 may be referred to as a sense pulse, the intermediate voltage during duration 515 may be referred to as an intermediate pulse, the growth voltage during duration 520 may be referred to as a growth pulse, and the setback voltage during duration 525 may be referred to as a setback pulse. In other examples, the sense voltage during duration 510 may be referred to as a first read voltage or a first read pulse, the intermediate voltage during duration 515 may be referred to as a second read voltage or a second read pulse, the growth voltage during duration 520 may be referred to as a third read voltage or a third read pulse, and the setback voltage during duration 525 may be referred to as a fourth read voltage or a fourth read pulse.

A memory cell (e.g., memory cell 105-a as described with reference to FIG. 2) may be written to by applying a write voltage during duration 501. The memory cell, in some examples, may include a memory element (e.g., memory element 220 as described with reference to FIG. 2) and a selector device (e.g., selector device 215 as described with reference to FIG. 2), and may be coupled with a first access line (e.g., word line 110-a as described with reference to FIG. 2) and a second access line (e.g., digit line 115-a as described with reference to FIG. 2).

During duration 501 a write voltage may be applied to one of the first access line or the second access line—depending on a polarity of the write voltage—which may result in the memory cell having a combination of crystalline and/or amorphous areas. The composition of the memory cell—the composition of the amorphousness and/or crystalline nature of the cell—may correspond to different logic states (e.g., a logic "1" or a logic "0"). To write to the memory cell with a positive polarity, as depicted in FIG. 5, a maximum write voltage (e.g., $V_{MAX}$) may be applied to the second access line during duration 501, and the first access line may be grounded. The voltage applied to the second access line may result in a current across the memory cell, which may alter the composition (e.g., the amorphousness or the crystalline nature) of the memory cell. In some examples, after applying the write voltage during duration 501, the write voltage may be removed during duration 505. Stated alternatively, no voltage may be applied to the memory cell during duration 505.

In some examples, the memory cell may be subsequently read (e.g., sensed) by applying a first read voltage during duration 510. The first read voltage may have a first polarity and, in some instances, the first polarity may be an opposite or a different polarity than the polarity of the write voltage. For example, a depicted in FIG. 5, the write voltage may be applied with a positive polarity and the first read voltage may be applied with a negative polarity. To apply the first read voltage with a negative polarity, a maximum read voltage (e.g., $V_{MAX}$) may be applied to the first access line, and the second access line may be grounded. In other examples (not shown), the first read voltage may be applied with a positive polarity by applying $V_{MAX}$ to the second access line, and grounding the first access line. In either example, the applied voltage may result in a current across the memory cell. Thus the increase in current across the memory cell, as depicted in FIG. 5, may be indicative of a particular logic state of the memory cell.

During the application of the first read voltage during duration 510, a sense amplifier or a sense component (e.g., sense component 125 as described with reference to FIG. 1) may be activated. During the period of activation, the sense amplifier may detect and amplify a difference in the read voltage applied across the memory cell, which may be referred to as latching. Subsequently, for example, the logic state of the memory cell may be determined based at least in part on applying the first read voltage. After determining the logic state of the memory cell, a second read voltage may be applied during duration 515.

In some examples, a second read voltage may be applied during duration 515. The second read voltage may, for example, be applied to the memory cell with a second polarity that is different form the first polarity. For example, as depicted in FIG. 5, the write voltage may be applied with a positive polarity, the first read voltage may be applied with a positive polarity, and the second read voltage may be applied with a negative polarity. In some examples, a magnitude of the first read voltage and the second read voltage may be different—or in the example of FIG. 5, lesser—than a magnitude of the write voltage.

During duration 515, a refresh operation of the memory cell may begin. In some examples, the second read voltage may be referred to as an intermediate voltage, or an opposite spike voltage, which may redistribute the memory cell based on any compositional changes caused by the first read voltage. Stated alternatively, during duration 515, the intermediate voltage may redistribute the amorphous phase segregation caused by the first read voltage, which may result in improved crystallization of the memory cell at later stages.

During duration 520, the refresh operation of the memory cell may continue and a third read voltage may be applied to the memory cell. In some examples, the third read voltage may have the first polarity and may be applied after applying the second read voltage. The third read voltage may be referred to as a growth voltage, and may result in a current across the memory cell. The current may, in some examples, begin transitioning the state of the memory cell from more-amorphous to more-crystalline. For example, during the application of the first read pulse, the composition of the memory cell may become more-amorphous. The application of the second read voltage may facilitate the transition of the memory cell's composition back to a crystalline state. And, by applying the third read voltage, the composition of the memory cell may shift back from more-amorphous to more-crystalline. By applying the third read voltage with an opposite polarity of the second read voltage—or with a same polarity as the first read voltage—the memory cell may more-effectively transition from an amorphous phase to a crystalline phase.

During duration 525, the refresh operation of the memory cell may continue. For example, during duration 525, a fourth read voltage having the first polarity may be applied to the memory cell. Stated alternatively, during duration 525, a fourth read voltage having the first polarity may be applied to the memory cell after applying the third read voltage. In some examples, the fourth read voltage may be referred to as a setback voltage, which may reintroduce the original state of the memory cell. For example, the setback voltage may further-improve the crystalline of memory cell from the growth pulse.

By reverting the cell back to its original amorphous or crystalline state as after the first read voltage was applied, any shift in the voltage distribution of the memory cell (e.g., drift) caused by applying the first read voltage may be mitigated. Stated alternatively, by applying the first read voltage with an opposite polarity as the write voltage, the voltage distribution of memory cell may shift due to inverse polarity effects of the read voltage. Thus, the application of the second voltage may refresh (e.g., "snap back") the distribution of the memory cell to similar state post-write-operation. In some examples, during duration 530, the second access line may be grounded, resulting in the removal any current across the memory cell (e.g., the current returning to 0 A). In some examples, during duration 530, the grounding of the second access line may be referred to as reducing the fourth read voltage to a fifth voltage. Thus, the fourth read voltage may be reduced to a fifth voltage after determining the logic state of the memory cell.

In another example (not shown), the polarities of the write and read voltages may be reversed as would be understood by a person of ordinary skill in the art. For example, the write voltage may be applied with a negative polarity, resulting in the first read voltage being applied with a negative polarity, the second read voltage being applied with a positive polarity, the third read voltage being applied with a negative polarity, and the fourth read voltage being applied with a negative polarity. In such an example, the same benefits (e.g., mitigating shifting of the voltage distribution of the memory cell) may be realized as were described above with reference to alternative examples.

Although the write voltage applied during duration 501 is illustrated as a step change in voltage, various examples of a write operation (e.g., a polarity-conditioned memory cell write operation) may include applying one or more voltages with different profiles over time. For example, the write voltage may be applied as a step change in voltage, a rectangular or square change in voltage, a ramped change in voltage, a triangular change in voltage, a linear or non-linear change in voltage, an exponential change in voltage, a logarithmic change in voltage, some combination of different changes in voltage, or any other profile.

Further, the voltages illustrated by the timing diagram 500 may refer to various portions of a circuit that includes a memory cell (e.g., memory cell 105 as described with reference to FIG. 1). For example, the illustrated voltages may refer to voltages across the terminals of a memory cell, across the memory element (e.g., memory element 220 as described with reference to FIG. 2) of a memory cell, between electrodes (e.g., electrode 205 as described with reference to FIG. 2) of a memory cell, between a location of a first access line (e.g., an access line 115 as described with reference to FIG. 1) and a location of a second access line (e.g., an access line 110 as described with reference to FIG. 1), or source voltages coupled with a memory cell (e.g., a difference between two voltage sources in electronic communication with the memory cell).

Figure 6:
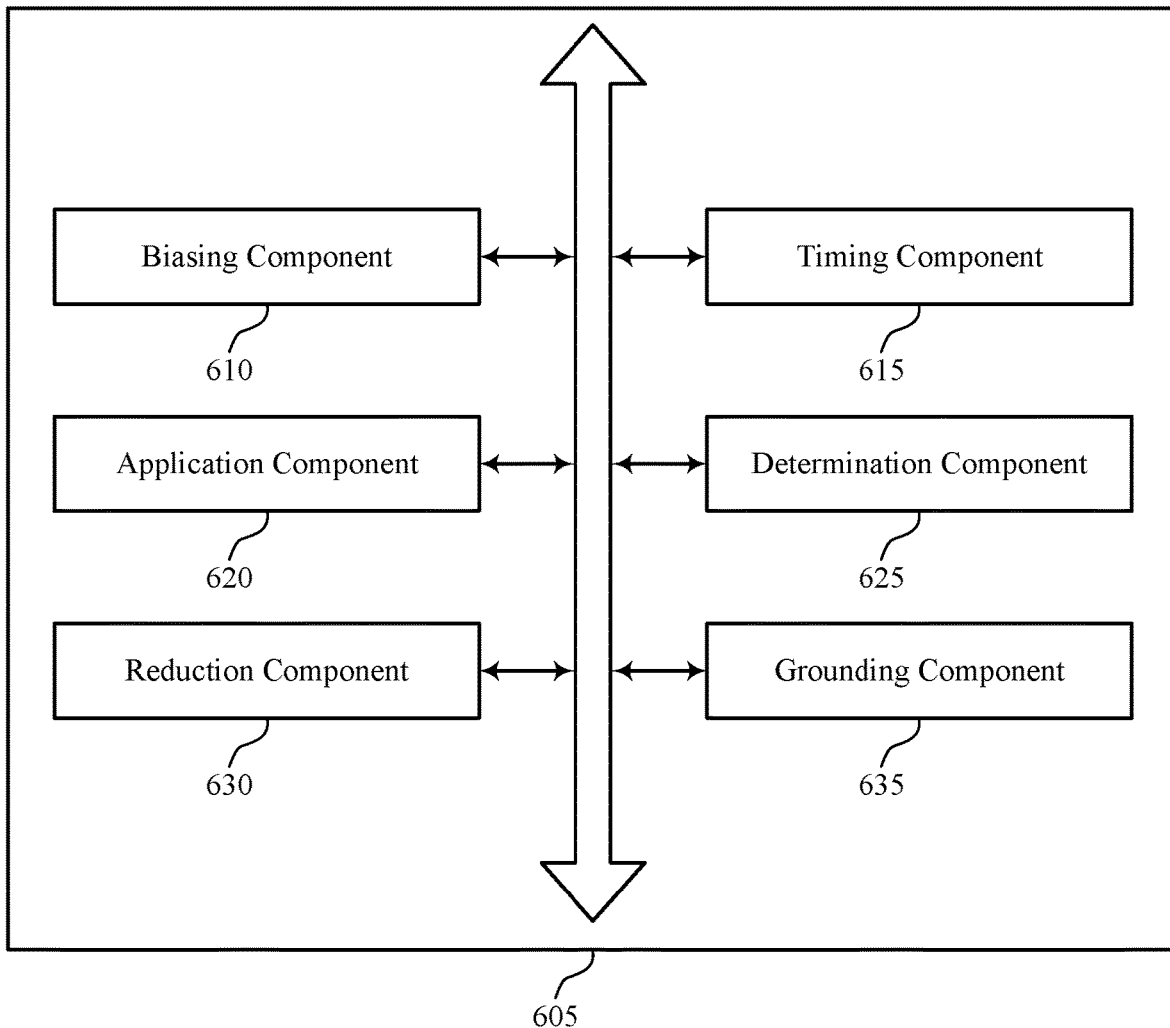
FIG. 6 shows a block diagram of a device that supports drift mitigation with embedded refresh in accordance with examples of the present disclosure.

FIG. 6 shows a block diagram 600 of a memory controller 605 that supports drift mitigation with embedded refresh in accordance with examples of the present disclosure. The memory controller 605 may be an example of aspects of a memory controller 140 as described with reference to FIG. 1. The memory controller 605 may include biasing component 610, timing component 615, application component 620, determination component 625, reduction component 630, and grounding component 635. Each of these modules may communicate, directly or indirectly, with one another (e.g., via one or more buses).

Application component 620 may apply a write voltage to a memory cell coupled with a first access line and a second access line. In some examples, the memory cell may include a memory storage element and a selector device. In other examples, application component 620 may apply a first read voltage having a first polarity to the memory cell after applying the write voltage. Additionally or alternatively, for example, application component 620 may apply a second read voltage having a second polarity different from the first polarity to the memory cell after applying the first read voltage. In some examples, application component 620 may apply a third read voltage having the first polarity to the memory cell after applying the second read voltage. The application of the third read voltage may be associated with a refresh operation of the memory cell. In other examples, application component 620 may apply a fourth read voltage having the first polarity to the memory cell after applying the third read voltage. The application of the fourth read voltage may be associated with a refresh operation of the memory cell. In some examples, application component 620 may apply any one of the read voltages concurrently. In other examples, application component 620 may apply any one of the read voltages sequentially. In yet another example, application component 620 may apply any one of the read voltages with a positive polarity or a negative polarity. Additionally or alternatively, for example, any one of the read voltages may be associated with a refresh operation of a memory cell.

In other examples, application component 620 may apply a third read voltage having the first polarity to the memory cell after applying the second read voltage. In some examples, the second read voltage may be greater than the third read voltage. In another example, the third read voltage may be associated with a refresh operation of the memory cell. In other examples, application component 620 may apply a fourth read voltage having the first polarity to the memory cell after applying the third read voltage. In some examples, the third read voltage may be greater than the fourth read voltage. In other examples, the fourth read voltage may be associated with a refresh operation of the memory cell.

In another example, application component 620 may apply a write pulse to a memory cell coupled with a first access line and a second access line. In some examples, the memory cell may include a memory storage element and a selector device. In another example, application component 620 may apply a first read pulse having an opposite polarity as the write pulse to the memory cell based at least in part on applying the write pulse. In some examples, the first read pulse may be associated with a sense operation. Additionally or alternatively, for example, application component 620 may apply a second read pulse having a same polarity as the write pulse to the memory cell based at least in part on applying the first read pulse. In other examples, application component 620 may apply a third read pulse having the same polarity as the write pulse to the memory cell based at least in part on applying the second read pulse. In some examples, application component 620 may apply a fourth read pulse having the same polarity as the write pulse to the memory cell after applying the third read pulse. The third read pulse and the fourth read pulse may each be associated with a refresh operation of the memory cell.

Determination component 625 may determine a logic state of the memory cell based at least in part on applying the first read voltage. In other examples, determination component 625 may determine a logic state of the memory cell based at least in part on applying the first read pulse.

Reduction component 630 may reduce the fourth read voltage to a fifth voltage after determining the logic state of the memory cell.

Figure 7:
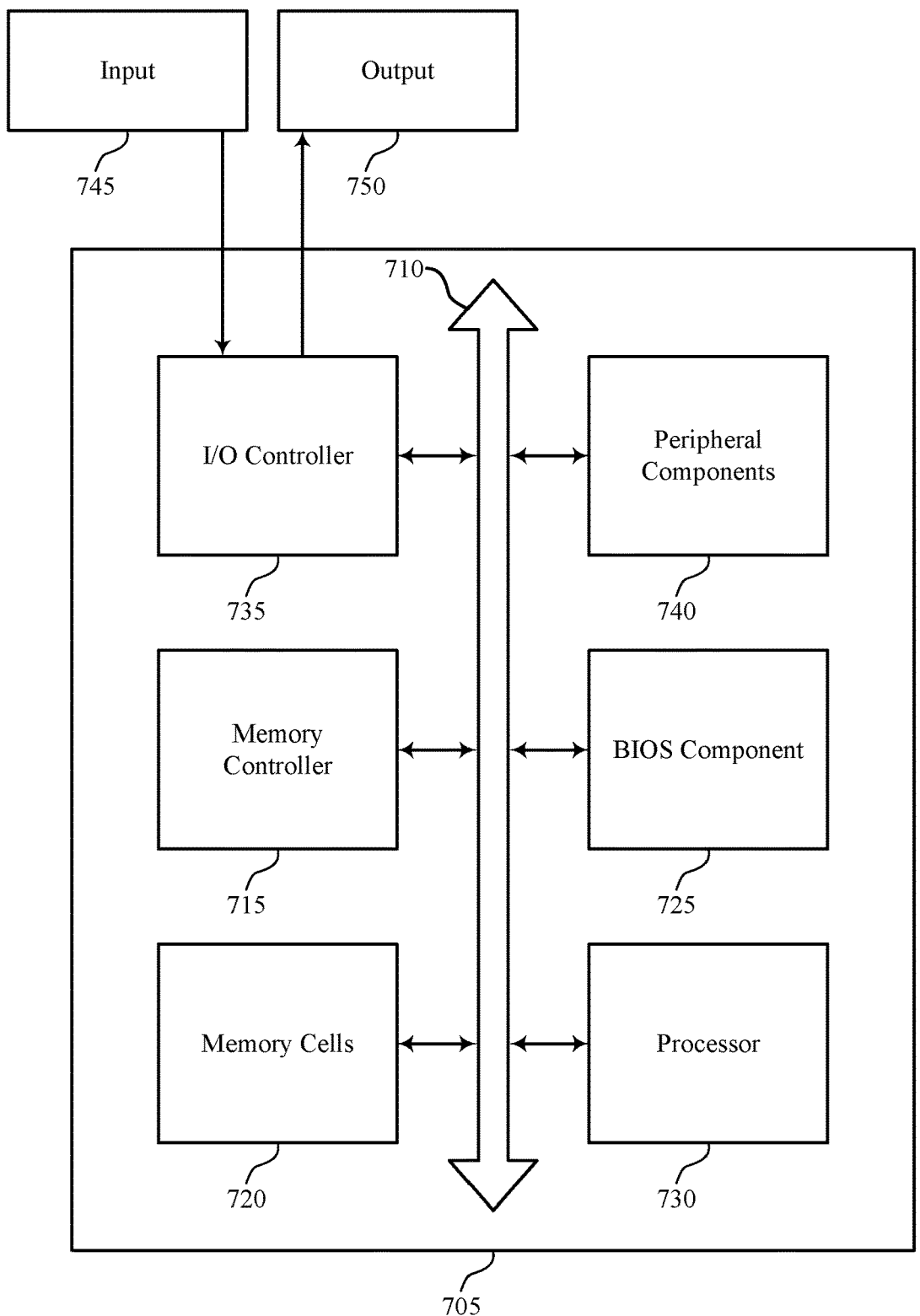
FIG. 7 illustrates a block diagram of a system including a memory array that supports drift mitigation with embedded refresh in accordance with examples of the present disclosure.

Grounding component 635 may ground at least one of the first access line or the second access line after applying the fourth read pulse FIG. 7 shows a diagram of a system 700 including a device 705 that supports drift mitigation with embedded refresh in accordance with examples of the present disclosure. Device 705 may be an example of or include components of memory array 100 or 200 as described above, e.g., with reference to FIGS. 1 and 2. Device 705 may include components for bi-directional voice and data communications including components for transmitting and receiving communications, including memory controller 715, memory cells 720, basic input/output system (BIOS) component 725, processor 730, I/O controller 735, and peripheral components 740. These components may be in electronic communication via one or more buses (e.g., bus 710).

Memory controller 715 may operate one or more memory cells as described herein. Specifically, memory controller 715 may be configured to support drift mitigation with embedded refresh. In some cases, memory controller 715 may include a row decoder, column decoder, or both, as described herein (not shown).

Memory cells 720 may store information (i.e., in the form of a logical state stored by respective ones of the memory cells 720) as described herein.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting drift mitigation with embedded refresh).

I/O controller 735 may manage input and output signals for device 705. I/O controller 735 may also manage peripherals not integrated into device 705. In some cases, I/O controller 735 may represent a physical connection or port to an external peripheral. In some cases, I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. In some cases, a user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a display, audio speakers, a printing device, another processor or printed circuit board, etc. In some cases, output 750 may be a peripheral element that interfaces with device 705 via peripheral component(s) 740. In some cases, output 750 may be managed by I/O controller 735

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device.

Figure 8:
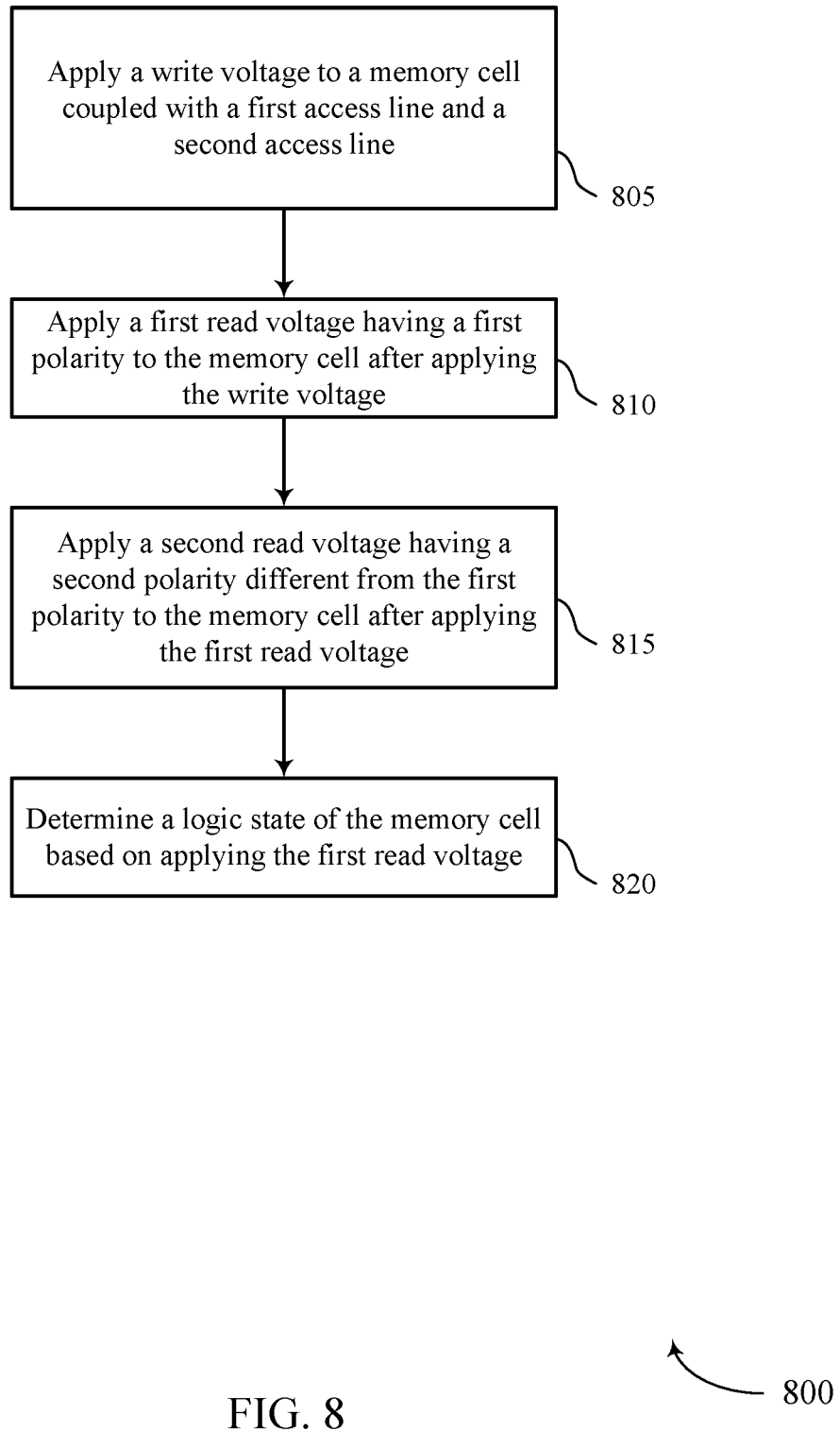
FIGS. 8 through 11 illustrate methods for drift mitigation with embedded refresh in accordance with examples of the present disclosure.

FIG. 8 shows a flowchart illustrating a method 800 for drift mitigation with embedded refresh in accordance with examples of the present disclosure. The operations of method 800 may be implemented or facilitated by a memory controller or its components as described herein. For example, the operations of method 800 may be performed by a memory controller as described with reference to FIGS. 1 through 7. In some examples, a memory controller may execute a set of instructions to control the functional elements of the device to perform the functions described herein (e.g., activating access lines in communication with a target memory cell, enabling or controlling voltage sources, coupling voltage sources to access lines in communication with a target memory cell 105, communicating with a sense component, etc.). Additionally or alternatively, the memory controller may perform aspects of the functions described below using special-purpose hardware.

At 805, a write voltage may be applied to a memory cell coupled with a first access line and a second access line. The operations of 805 may be performed according to the methods described herein (e.g., according aspects of the timing diagrams 300, 400, and 500 described with reference to FIGS. 3-5). In certain examples, aspects of the operations of 805 may be performed by an application component as described with reference to FIG. 6.

At 810, a first read voltage having a first polarity may be applied to the memory cell after applying the write voltage. The operations of 810 may be performed according to the methods described herein (e.g., according to the timing diagrams 300, 400, and 500 described with reference to FIGS. 3-5). In certain examples, aspects of the operations of 805 may be performed by an application component as described with reference to FIG. 6.

At 815, a second read voltage having a second polarity different from the first polarity may be applied to the memory cell after applying the first read voltage. The operations of 815 may be performed according to the methods described herein (e.g., according to the timing diagrams 300, 400, and 500 described with reference to FIGS. 3-5). In certain examples, aspects of the operations of 810 may be performed by an application component as described with reference to FIG. 6

At 820, the memory controller may determine a logic state of the memory cell based at least in part on applying the first read voltage. The operations of 820 may be performed according to the methods described herein (e.g., according to the timing diagrams 300, 400, and 500 described with reference to FIGS. 3-5). In certain examples, aspects of the operations of 820 may be performed by a sense component 125 as described with reference to FIG. 1 or a determination component as described with reference to FIG. 6.

In some examples, the second read voltage may be associated with a refresh operation of the memory cell. In other examples, the method may include applying a second read voltage having a second polarity different from the first polarity to the memory cell after applying the first read voltage. Additionally or alternatively, the method may include determining a logic state of the memory cell based at least in part on applying the first read voltage.

In some cases, the method may include applying a third read voltage having the first polarity to the memory cell after applying the second read voltage. In some examples, the third read voltage may be associated with a refresh operation of the memory cell. In other cases, the method may include applying a fourth read voltage having the first polarity to the memory cell after applying the third read voltage. In some examples, the fourth read voltage may be associated with a refresh operation of the memory cell. In some cases, the method may also include reducing the fourth read voltage to a fifth voltage after determining the logic state of the memory cell.

In other examples, the method may include applying a first read voltage having a first polarity to the memory cell after applying the write voltage. In some cases, the third read voltage may be greater than the fourth read voltage. In some examples, the first polarity may be a positive polarity and the second polarity may be a negative polarity. In other cases, the first polarity may be a negative polarity and the second polarity may a positive polarity. In some cases, the write voltage may be of the second polarity. Additionally or alternatively, for example, the memory cell may be a multi-level cell (MLC) that includes chalcogenide. In other cases, the write voltage may be greater than the first read voltage, the second read voltage, the third read voltage, and the fourth read voltage.

Figure 9:
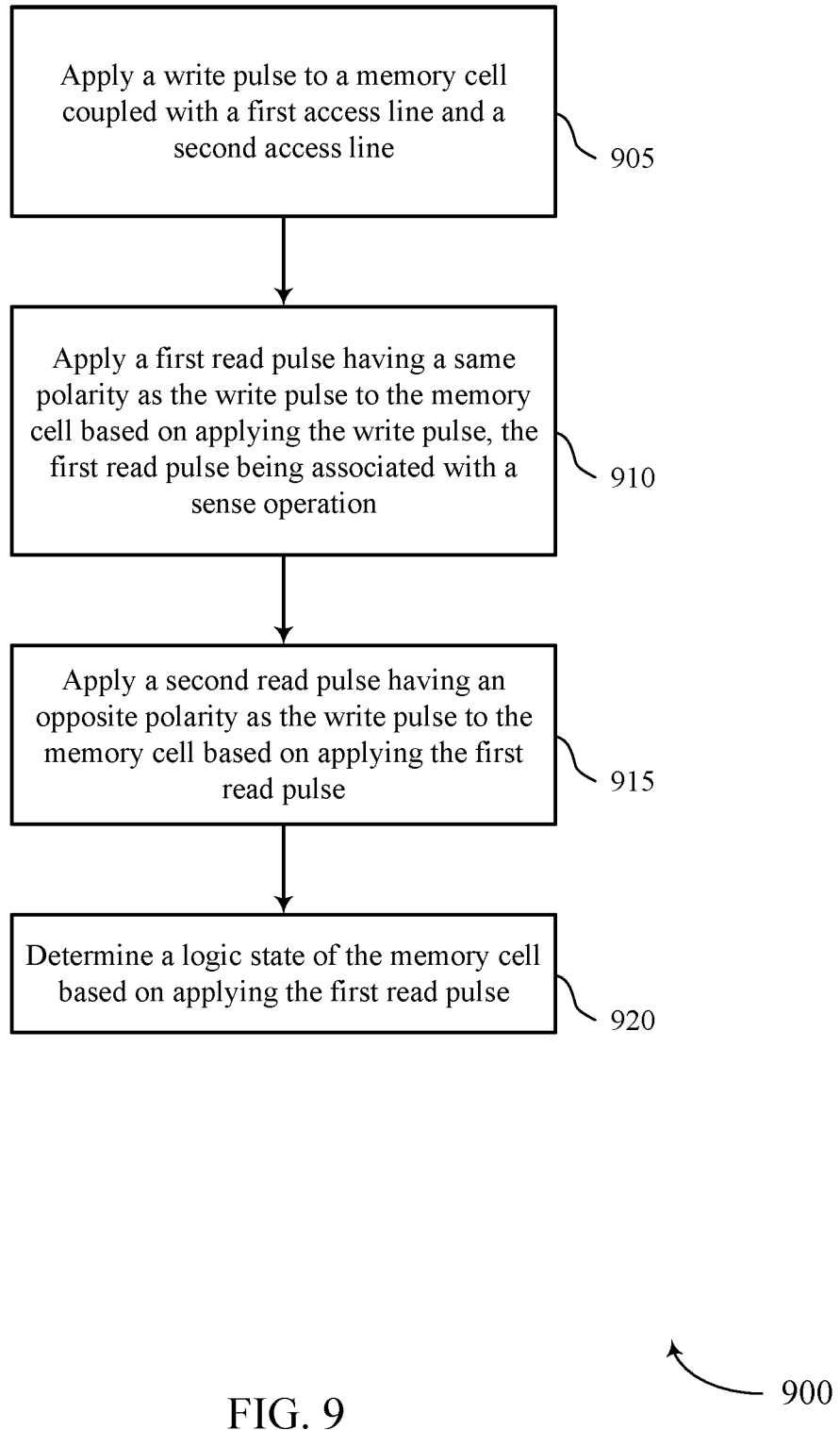

FIG. 9 shows a flowchart illustrating a method 900 for drift mitigation with embedded refresh in accordance with examples of the present disclosure. The operations of method 900 may be implemented by a memory controller or its components as described herein. For example, the operations of method 900 may be performed by a memory controller as described with reference to FIGS. 1 through 7. In some examples, a memory controller may execute a set of codes to control the functional elements of the device to perform the functions described below. Additionally or alternatively, the memory controller may perform aspects of the functions described below using special-purpose hardware.

At 905 a write pulse may be applied to a memory cell coupled with a first access line and a second access line. The operations of 905 may be performed according to the methods described herein. In certain examples, aspects of the operations of 905 may be performed by an application component as described with reference to FIG. 6.

At 910 a first read pulse having a same polarity as the write pulse may be applied to the memory cell based at least in part on applying the write pulse. In some examples, the first read pulse may be associated with a sense operation. The operations of 910 may be performed according to the methods described herein. In certain examples, aspects of the operations of 910 may be performed by an application component as described with reference to FIG. 6.

At 915 a second read pulse having an opposite polarity as the write pulse may be applied to the memory cell based at least in part on applying the first read pulse. The operations of 915 may be performed according to the methods described herein. In certain examples, aspects of the operations of 915 may be performed by an application component as described with reference to FIG. 6.

At 920 a logic state of the memory cell may be determined based at least in part on applying the first read pulse. The operations of 920 may be performed according to the methods described herein. In certain examples, aspects of the operations of 920 may be performed by a determination component as described with reference to FIG. 6.

In some cases, the method may include applying a first read pulse having a same polarity as the write pulse to the memory cell based at least in part on applying the write pulse. In some examples, the first read pulse may be associated with a sense operation. In other cases, the method may include applying a second read pulse having an opposite polarity as the write pulse to the memory cell based at least in part on applying the first read pulse. In some examples, the method may include determining a logic state of the memory cell based at least in part on applying the first read pulse. Additionally or alternatively, for example, the method may include applying a third read pulse having the same polarity as the write pulse to the memory cell based at least in part on applying the second read pulse. In some examples, the method may include applying a fourth read pulse having the same polarity as the write pulse to the memory cell after applying the third read pulse. The third read pulse and the fourth read pulse may be associated with a refresh operation of the memory cell. In some examples, the method may include grounding at least one of the first access line or the second access line after applying the fourth read pulse.

Figure 10:
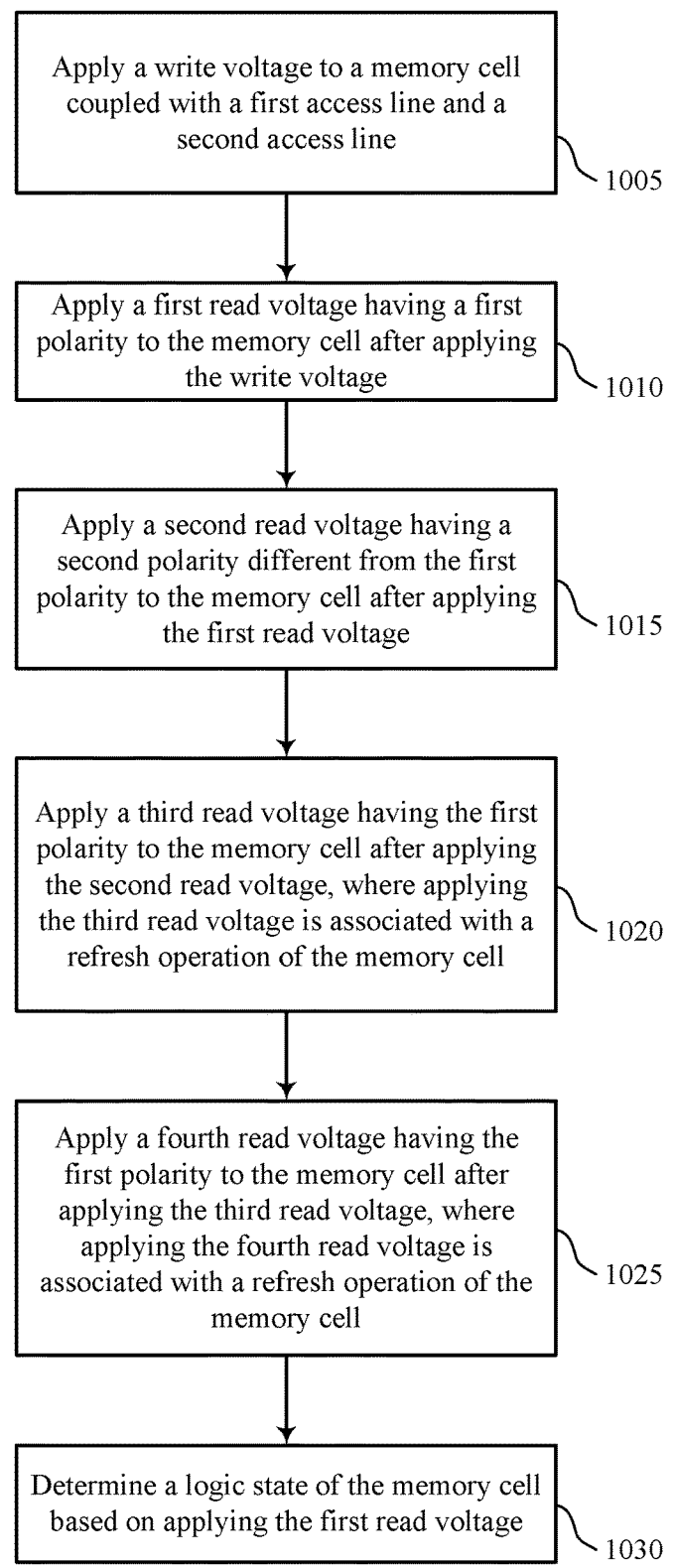

FIG. 10 shows a flowchart illustrating a method 1000 for drift mitigation with embedded refresh in accordance with examples of the present disclosure. The operations of method 1000 may be implemented by a memory controller or its components as described herein. For example, the operations of method 1000 may be performed by a memory controller as described with reference to FIG. 1. In some examples, a controller may execute a set of codes to control the functional elements of the device to perform the functions described below. Additionally or alternatively, the c may perform aspects of the functions described below using special-purpose hardware.

At 1005 a write voltage may be applied to a memory cell coupled with a first access line and a second access line. The operations of 1005 may be performed according to the methods described herein. In certain examples, aspects of the operations of 1005 may be performed by a controller as described with reference to FIG. 1.

At 1010 a first read voltage having a first polarity may be applied to the memory cell after applying the write voltage. The operations of 1010 may be performed according to the methods described herein. In certain examples, aspects of the operations of 1010 may be performed by an application component as described with reference to FIG. 6.

At 1015 a second read voltage having a second polarity different from the first polarity may be applied to the memory cell after applying the first read voltage. The operations of 1015 may be performed according to the methods described herein. In certain examples, aspects of the operations of 1015 may be performed by an application component as described with reference to FIG. 6.

At 1020 a third read voltage having the first polarity may be applied to the memory cell after applying the second read voltage, wherein applying the third read voltage is associated with a refresh operation of the memory cell. The operations of 1020 may be performed according to the methods described herein. In certain examples, aspects of the operations of 1020 may be performed by an application component as described with reference to FIG. 6.

At 1025 a fourth read voltage having the first polarity may be applied to the memory cell after applying the third read voltage, wherein applying the fourth read voltage is associated with a refresh operation of the memory cell. The operations of 1025 may be performed according to the methods described herein. In certain examples, aspects of the operations of 1025 may be performed by an application component as described with reference to FIG. 6.

At 1030 a logic state of the memory cell may be determined based at least in part on applying the first read voltage. The operations of 1030 may be performed according to the methods described herein. In certain examples, aspects of the operations of 1030 may be performed by a determination component as described with reference to FIG. 6.

Figure 11:
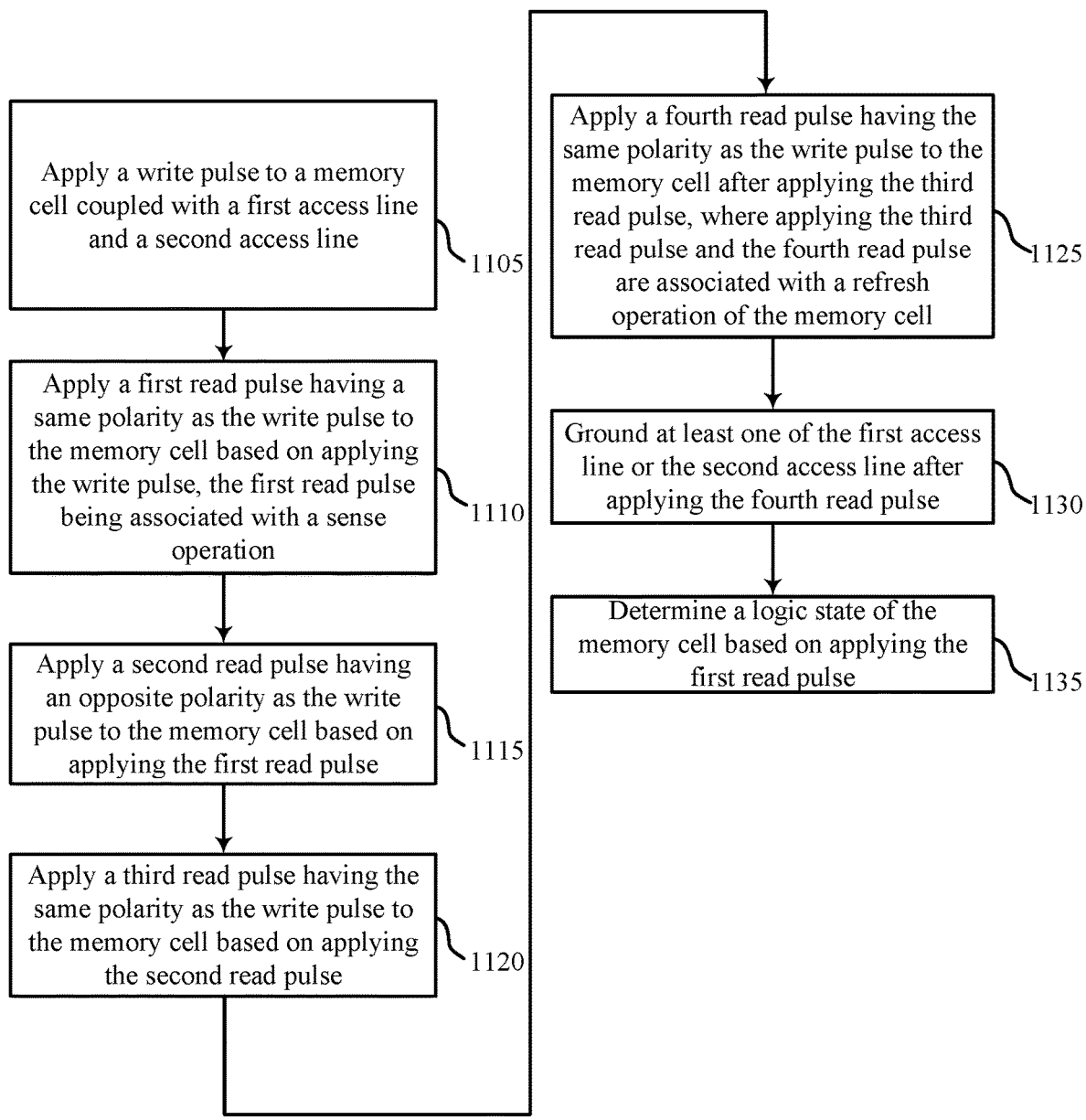

FIG. 11 shows a flowchart illustrating a method 1100 for drift mitigation with embedded refresh in accordance with examples of the present disclosure. The operations of method 1100 may be implemented by a memory controller or its components as described herein. For example, the operations of method 1100 may be performed by a memory controller as described with reference to FIG. 1. In some examples, a memory controller may execute a set of codes to control the functional elements of the device to perform the functions described below. Additionally or alternatively, the memory controller may perform aspects of the functions described below using special-purpose hardware.

At 1105 a write pulse may be applied to a memory cell coupled with a first access line and a second access line. The operations of 1105 may be performed according to the methods described herein. In certain examples, aspects of the operations of 1105 may be performed by an application component as described with reference to FIG. 6.

At 1110 a first read pulse having a same polarity as the write pulse may be applied to the memory cell based at least in part on applying the write pulse, the first read pulse being associated with a sense operation. The operations of 1110 may be performed according to the methods described herein. In certain examples, aspects of the operations of 1110 may be performed by an application component as described with reference to FIG. 6.

At 1115 a second read pulse having an opposite polarity as the write pulse may be applied to the memory cell based at least in part on applying the first read pulse. The operations of 1115 may be performed according to the methods described herein. In certain examples, aspects of the operations of 1115 may be performed by an application component as described with reference to FIG. 6.

At 1120 a third read pulse having the same polarity as the write pulse may be applied to the memory cell based at least in part on applying the second read pulse. The operations of 1120 may be performed according to the methods described herein. In certain examples, aspects of the operations of 1120 may be performed by an application component as described with reference to FIG. 6.

At 1125 a fourth read pulse having the same polarity as the write pulse may be applied to the memory cell after applying the third read pulse, wherein applying the third read pulse and the fourth read pulse are associated with a refresh operation of the memory cell. The operations of 1125 may be performed according to the methods described herein. In certain examples, aspects of the operations of 1125 may be performed by an application component as described with reference to FIG. 6.

At 1130 at least one of the first access line or the second access line may be grounded after applying the fourth read pulse. The operations of 1130 may be performed according to the methods described herein. In certain examples, aspects of the operations of 1130 may be performed by a grounding component as described with reference to FIG. 6.

At 1135 a logic state of the memory cell may be determined based at least in part on applying the first read pulse. The operations of 1135 may be performed according to the methods described herein. In certain examples, aspects of the operations of 1135 may be performed by a determination component as described with reference to FIG. 6.

It should be noted that the methods described above describe possible implementations, and that the operations and the steps may be rearranged or otherwise modified and that other implementations are possible. Further, examples from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

As used herein, the term "terminal" need not suggest a physical boundary or connection point of a circuit element. Rather, "terminal" may refer to a reference point of a circuit relevant to the circuit element, which may also be referred to as a "node" or "reference point."

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory arrays 100 and 200 described with reference to FIGS. 1 and 2, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

As used herein, the term "substantially" means that the modified characteristic (e.g., a verb or adjective modified by the term substantially) need not be absolute but is close enough so as to achieve the advantages of the characteristic.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    applying a write voltage to a memory cell comprising a memory storage element and a selector device;
    applying a first read voltage having a first polarity to the memory cell after applying the write voltage;
    applying a second read voltage having a second polarity to the memory cell after applying the first read voltage, the first read voltage and the second read voltage applied during a same access operation; and
    determining a logic state of the memory cell based at least in part on applying the first read voltage, or the second read voltage, or both.

2. The method of claim 1, further comprising:
refreshing the memory cell after applying the second read voltage by applying a third read voltage to the memory cell.

3. The method of claim 2, wherein refreshing the memory cell further comprises:
applying a fourth read voltage to the memory cell after applying the third read voltage.

4. The method of claim 3, wherein the third read voltage and the fourth read voltage comprise the first polarity.

5. The method of claim 3, further comprising:
grounding an access line coupled with the memory cell based at least in part on applying the fourth read voltage to the memory cell; and
applying a fifth voltage to the memory cell based at least in part on grounding the access line.

6. The method of claim 5, further comprising:
reducing the fourth read voltage applied to the memory cell based at least in part on applying the fifth voltage, wherein applying the fifth voltage to the memory cell is based at least in part on reducing the fourth read voltage applied to the memory cell.

7. The method of claim 1, wherein the write voltage comprises a positive polarity and at least one of the first read voltage or the second read voltage comprises a negative polarity.

8. The method of claim 1, wherein the first polarity of the first read voltage comprises an opposite polarity compared to a polarity of the first write voltage and the second write voltage.

9. The method of claim 1, wherein applying the second read voltage refreshes the memory cell.

10. The method of claim 1, wherein the memory cell comprises a chalcogenide material.

11. A memory device, comprising:
a memory cell comprising a memory element and a selector device;
a first access line coupled with the memory cell;
a second access line coupled with the memory cell; and
a memory controller coupled with the first access line and the second access line, the memory controller operable to:
apply, during a read operation, a first voltage having a first polarity to the memory cell;
apply, during the read operation, a second voltage having a second polarity to the memory cell after applying the first voltage, wherein applying the second voltage is associated with a refresh operation of the memory cell; and
determine a logic state of the memory cell based at least in part on applying the first voltage and applying the second voltage.

12. The memory device of claim 11, wherein the memory controller is operable to:
apply a write voltage to the memory cell, wherein the memory controller is operable to apply the first voltage having the first polarity based at least in part on applying the write voltage.

13. The memory device of claim 11, wherein the memory controller is operable to:
apply a third voltage to the memory cell after applying the second voltage; and
apply a fourth voltage to the memory cell after applying the third voltage, wherein the third voltage and the fourth voltage have a same polarity and are associated with the refresh operation of the memory cell.

14. The memory device of claim 13, wherein the memory controller is operable to:
ground the memory cell based at least in part on applying the fourth voltage to the memory cell.

15. The memory device of claim 11, wherein the memory cell comprises a multi-level cell (MLC) that includes a chalcogenide material.

16. An apparatus, comprising:
a memory cell comprising a memory element and a selector device;
a first access line coupled with the memory cell;
a second access line coupled with the memory cell; and
a memory controller coupled with the first access line and the second access line, the memory controller operable to:
apply a write pulse to the memory cell;
apply a first read pulse having an opposite polarity as the write pulse to the memory cell based at least in part on applying the write pulse;
apply a second read pulse having a same polarity as the write pulse to the memory cell based at least in part on applying the first read pulse, wherein applying the second read pulse is associated with a refresh operation of the memory cell; and
determine a logic state of the memory cell based at least in part on applying the first read pulse.

17. The apparatus of claim 16, wherein the memory controller is operable to:
refresh the memory cell after applying the second read pulse by applying a third read pulse to the memory cell and applying a fourth read pulse to the memory cell after applying the third read pulse.

18. The apparatus of claim 17, wherein the memory controller is operable to:
ground an access line coupled with the memory cell based at least in part on applying the fourth read pulse to the memory cell; and
reduce a magnitude of the fourth read pulse based at least in part on grounding the access line.

19. The apparatus of claim 17, wherein a magnitude of the third read pulse is greater than a magnitude of the fourth read pulse.

20. The apparatus of claim 16, wherein the memory controller is operable to:
apply the first read pulse during an access operation associated with the memory cell; and
apply the second read pulse during the access operation associated with the memory cell.

* * * * *